United States Patent
Takeda et al.

(10) Patent No.: US 11,474,433 B2
(45) Date of Patent: Oct. 18, 2022

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Yuki Takeda, Oyama (JP); Yutaka Shiraishi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 294 days.

(21) Appl. No.: 16/842,577

(22) Filed: Apr. 7, 2020

(65) Prior Publication Data

US 2020/0233309 A1   Jul. 23, 2020

Related U.S. Application Data

(63) Continuation of application No. PCT/JP2017/041281, filed on Nov. 16, 2017.

(51) Int. Cl.
*G03F 7/20* (2006.01)
*H01L 21/027* (2006.01)

(52) U.S. Cl.
CPC ........ *G03F 7/2004* (2013.01); *G03F 7/70033* (2013.01); *H01L 21/0275* (2013.01)

(58) Field of Classification Search
CPC ............... G03F 7/2004; G03F 7/70033; G03F 7/70916; H01L 21/0275; H05G 2/006; H05G 2/005; H05G 2/008
See application file for complete search history.

(56) References Cited

U.S. PATENT DOCUMENTS

2009/0154642 A1* 6/2009 Bykanov ............... H05G 2/003
378/34
2011/0204249 A1  8/2011 Nagai et al.
(Continued)

FOREIGN PATENT DOCUMENTS

JP   2006-100363 A   4/2006
JP   2010-538456 A   12/2010
(Continued)

OTHER PUBLICATIONS

International Search Report issued in PCT/JP2017/041281; dated Feb. 13, 2018.
(Continued)

*Primary Examiner* — Mesfin T Asfaw
(74) *Attorney, Agent, or Firm* — Studebaker & Brackett PC

(57) ABSTRACT

An extreme ultraviolet light generation apparatus that generates plasma by irradiating a target substance with a pulse laser beam and generates extreme ultraviolet light from the plasma includes: a chamber housing a collector mirror configured to condense the extreme ultraviolet light; a gas introduction pipe through which gas is introduced into the chamber; a mass flow controller configured to change the flow rate of the gas; a discharge pump configured to discharge the gas from the chamber; a pressure sensor configured to monitor the pressure in the chamber; and a control unit configured to control the mass flow controller based on the pressure measured by using the pressure sensor. The control unit controls the mass flow controller to increase an increase ratio of the flow rate of the gas entering the chamber as the pressure acquired by the pressure sensor increases.

20 Claims, 20 Drawing Sheets

(56) References Cited

U.S. PATENT DOCUMENTS

2014/0216576 A1* 8/2014 Someya ................ H05G 2/008
137/560
2018/0224748 A1 8/2018 Nagai et al.

FOREIGN PATENT DOCUMENTS

| JP | 2011-192964 A | 9/2011 |
| WO | 2009/032055 A1 | 3/2009 |
| WO | 2017/077641 A1 | 5/2017 |

OTHER PUBLICATIONS

International Preliminary Report on Patentability and Written Opinion issued in PCT/JP2017/041281; dated May 19, 2020.

* cited by examiner

Fig. 19
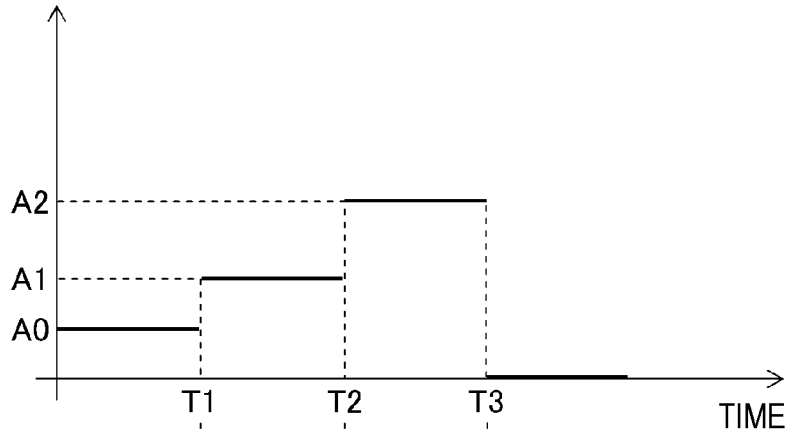
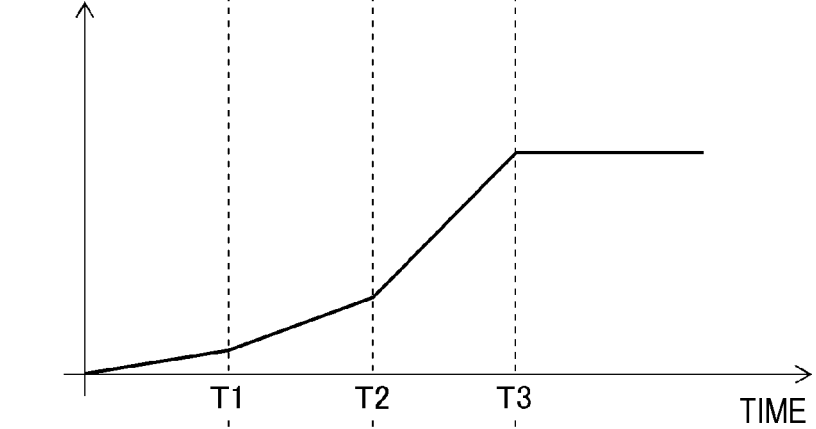
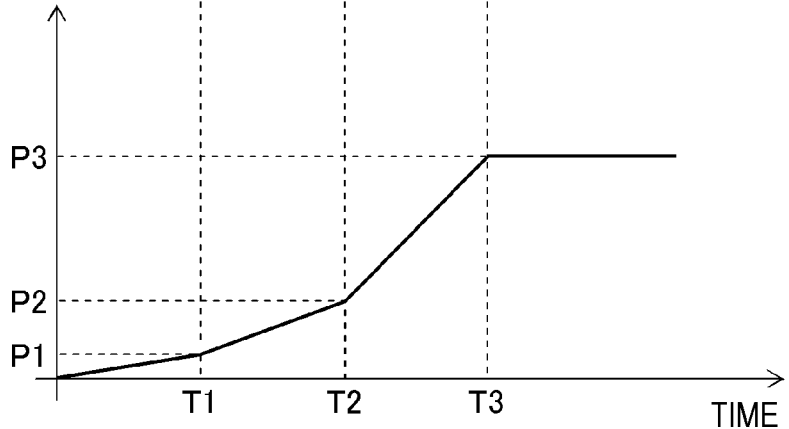

Fig. 23
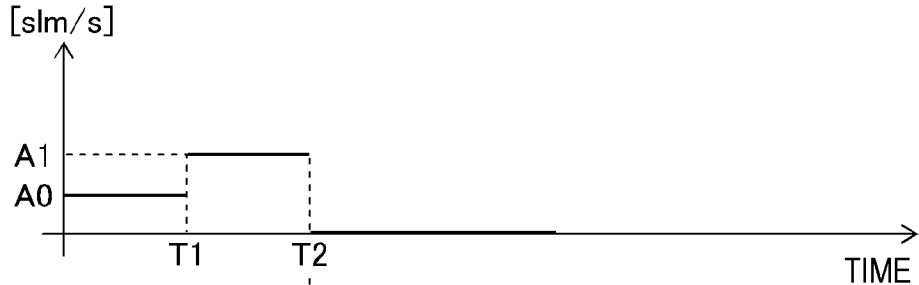
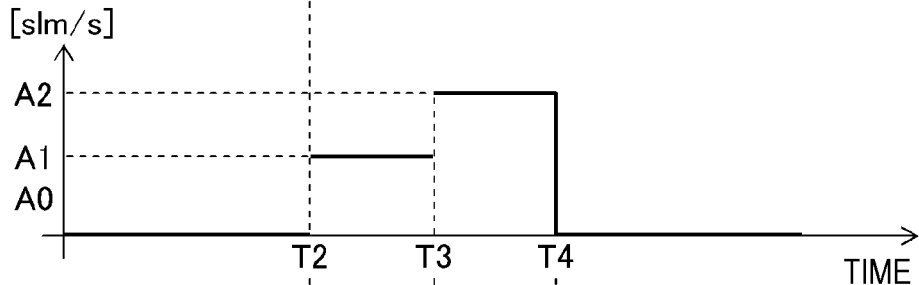
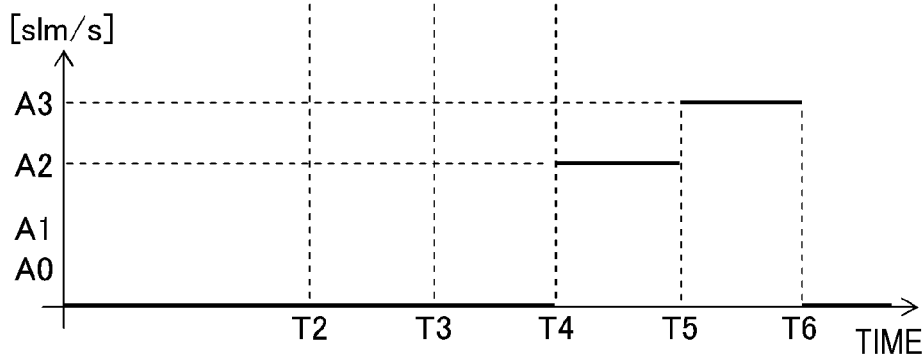

EXTREME ULTRAVIOLET LIGHT GENERATION APPARATUS AND ELECTRONIC DEVICE MANUFACTURING METHOD

CROSS-REFERENCE TO RELATED APPLICATIONS

The present application is a continuation application of International Application No. PCT/JP2017/041281, filed on Nov. 16, 2017. The content of the application is incorporated herein by reference in its entirety.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation apparatus that generates extreme ultraviolet (EUV) light at a wavelength of 13 nm approximately in combination with reduced projection reflective optics.

Disclosed EUV light generation apparatuses include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Document

Patent Document 1: International Patent Publication No. 2017/077641

SUMMARY

An extreme ultraviolet light generation apparatus according to an aspect of the present disclosure generates plasma by irradiating a target substance with a pulse laser beam and generates extreme ultraviolet light from the plasma, and includes: a chamber housing a collector mirror configured to condense the extreme ultraviolet light; a gas introduction pipe through which gas is introduced into the chamber; a mass flow controller configured to change the flow rate of the gas; a discharge pump configured to discharge the gas from the chamber; a pressure sensor configured to monitor the pressure in the chamber; and a control unit configured to control the mass flow controller based on the pressure measured by using the pressure sensor. The control unit controls the mass flow controller to increase an increase ratio of the flow rate of the gas entering the chamber as the pressure acquired by the pressure sensor increases.

An extreme ultraviolet light generation apparatus according to another aspect of the present disclosure generates plasma by irradiating a target substance with a pulse laser beam and generates extreme ultraviolet light from the plasma, and includes: a chamber housing a collector mirror configured to condense the extreme ultraviolet light; a gas introduction pipe through which gas is introduced into the chamber; a mass flow controller configured to change the flow rate of the gas; a discharge pump configured to discharge the gas from the chamber; a timer configured to measure a time since the start of introduction of the gas into the chamber; and a control unit configured to control the mass flow controller based on the time measured by using the timer. The control unit controls the mass flow controller to increase the increase ratio of the flow rate of the gas entering the chamber as the time measured by using the timer elapses.

BRIEF DESCRIPTION OF THE DRAWINGS

Embodiments of the present disclosure will be described below as examples with reference to the accompanying drawings.

FIG. 19 is an explanatory diagram including a graph exemplarily indicating the relation between time and each of the increase ratio of the hydrogen flow rate, the hydrogen flow rate, and the pressure.

FIG. 23 is an explanatory diagram including a graph indicating the relation between the increase ratio of the hydrogen flow rate at each of a plurality of mass flow controllers in an EUV light generation apparatus according to Embodiment 5 and time.

DESCRIPTION OF EMBODIMENTS

Contents
1. Overall description of extreme ultraviolet light generation system
 1.1 Configuration
 1.2 Operation
2. Terms
3. Specific example of EUV light generation apparatus
 3.1 Configuration
 3.2 Operation
4. Problems
 4.1 Problem 1
 4.2 Problem 2
 4.3 Problem 3
5. Embodiment 1
 5.1 Configuration
 5.2 Operation
 5.3 Effect
 5.4 Modification
6. Embodiment 2
 6.1 Configuration
 6.2 Operation
 6.3 Effect
7. Embodiment 3
 7.1 Configuration
 7.2 Operation
 7.3 Effect
8. Embodiment 4
 8.1 Configuration
 8.2 Operation
 8.3 Effect
9. Embodiment 5
 9.1 Configuration
 9.2 Operation
 9.3 Effect
10. Laser apparatus
11. Exemplary electronic device manufacturing method using EUV light generation apparatus Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
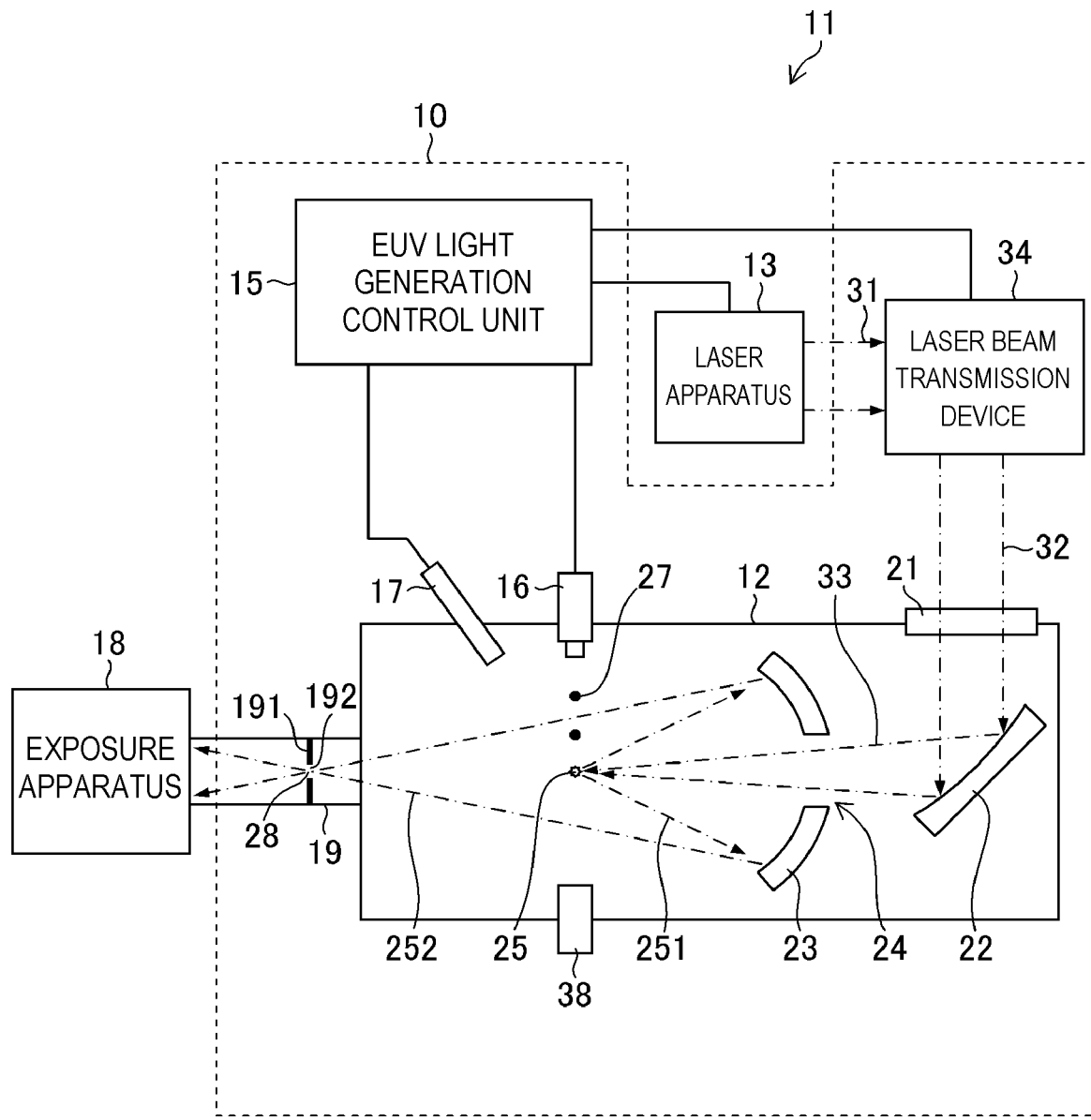
FIG. 1 is a diagram schematically illustrating the configuration of an exemplary LPP EUV light generation system.

1. Overall Description of Extreme Ultraviolet Light Generation System 1.1 Configuration FIG. 1 schematically illustrates the configuration of an exemplary LPP EUV light generation system. This EUV light generation apparatus 10 is used together with at least one laser apparatus 13 in some cases. In the present application, a system including the EUV light generation apparatus 10 and the laser apparatus 13 is referred to as an EUV light generation system 11. As illustrated in FIG. 1 and described below in detail, the EUV light generation apparatus 10 includes a chamber 12 and a target supply unit 16.

The chamber 12 is a sealable container. The target supply unit 16 supplies a target substance into the chamber 12 and is attached to, for example, penetrate through the wall of the chamber 12. The material of the target substance may contain tin, terbium, gadolinium, lithium, xenon, or a combination of two or more of these materials, but is not limited thereto.

The wall of the chamber 12 is provided with at least one through-hole. The through-hole is blocked by a window 21 through which a pulse laser beam 32 output from the laser apparatus 13 transmits. For example, an EUV condensation mirror 23 having a spheroidal reflective surface is disposed inside the chamber 12.

The EUV condensation mirror 23 has a first focal point and a second focal point. For example, a multi-layer reflective film obtained by alternately stacking molybdenum and silicon is formed on the surface of the EUV condensation mirror 23. The EUV condensation mirror 23 may be disposed so that, for example, the first focal point is positioned in a plasma generation region 25 and the second focal point is positioned at an intermediate focal point (IF) 28. The EUV condensation mirror 23 is provided with a through-hole 24 at a central part, through which a pulse laser beam 33 passes.

The EUV light generation apparatus 10 includes an EUV light generation control unit 15 and a target sensor 17. The target sensor 17 detects one or a plurality of the existence, locus, position, and speed of a target 27. The target sensor 17 may have an image capturing function.

The EUV light generation apparatus 10 also includes a connection unit 19 that provides communication between the inside of the chamber 12 and the inside of an exposure apparatus 18. The connection unit 19 includes a wall 191 through which an aperture 192 is formed. The wall 191 is disposed so that the aperture 192 is positioned at the second focal point of the EUV condensation mirror 23.

In addition, the EUV light generation apparatus 10 includes a laser beam transmission device 34, a laser beam condensation mirror 22, and a target collection unit 38 for collecting the target 27. The laser beam transmission device 34 includes an optical element for defining the transmission state of a laser beam, and an actuator adjusting the position, posture, or the like of the optical element.

1.2 Operation

The following describes operation of the exemplary LPP EUV light generation system with reference to FIG. 1.

A pulse laser beam 31 output from the laser apparatus 13 passes through the laser beam transmission device 34 and is incident in the chamber 12 through the window 21 as the pulse laser beam 32. The pulse laser beam 32 travels along at least one laser beam path in the chamber 12 and is reflected by the laser beam condensation mirror 22 and incident on at least one target 27 as the pulse laser beam 33.

The target supply unit 16 outputs the target 27 made of the target substance toward the plasma generation region 25 in the chamber 12.

The target 27 is irradiated with at least one pulse included in the pulse laser beam 33. Plasma is generated from the target 27 irradiated with the pulse laser beam and radiates radiation light 251. EUV light 252 included in the radiation light 251 is selectively reflected by the EUV condensation mirror 23. The EUV light 252 reflected by the EUV condensation mirror 23 is condensed at the intermediate focal point 28 and output to the exposure apparatus 18. One target 27 may be irradiated with a plurality of pulses included in the pulse laser beam 33.

The EUV light generation control unit 15 collectively controls the entire EUV light generation system 11. The EUV light generation control unit 15 processes a result of detection by the target sensor 17. The EUV light generation control unit 15 may control the output timing of the target 27, the output direction of the target 27, and the like based on the result of detection by the target sensor 17. In addition, the EUV light generation control unit 15 may control the oscillation timing of the laser apparatus 13, the traveling direction of the pulse laser beam 32, the condensation position of the pulse laser beam 33, and the like. These various kinds of control are merely exemplary, and may include other control as necessary.

2. Terms

"Target" is an object irradiated with a laser beam introduced into the chamber. When irradiated with the laser beam, the target generates plasma and radiates EUV light. The target is a plasma generation source.

"Droplet" is a form of the target supplied into the chamber. The droplet may mean the target deformed into a substantially spherical shape due to the surface tension of the melted target substance.

"Pulse laser beam" may be a laser beam including a plurality of pulses.

"Laser beam" is not limited to a pulse laser beam but may be a general laser beam.

"Laser beam path" is the optical path of a laser beam.

"Plasma light" is radiation light radiated from the target as plasma. This radiation light includes EUV light.

"EUV light" stands for "extreme ultraviolet light". "EUV light generation apparatus" stands for "extreme ultraviolet light generation apparatus".

"Plasma generation region" may mean a region in which plasma generation is started for EUV light generation.

"Piezoelectric element" is synonymous with dielectric element. The piezoelectric element is also simply referred to as "piezoelectric".

3. Specific Example of EUV Light Generation Apparatus

3.1 Configuration

Figure 2:
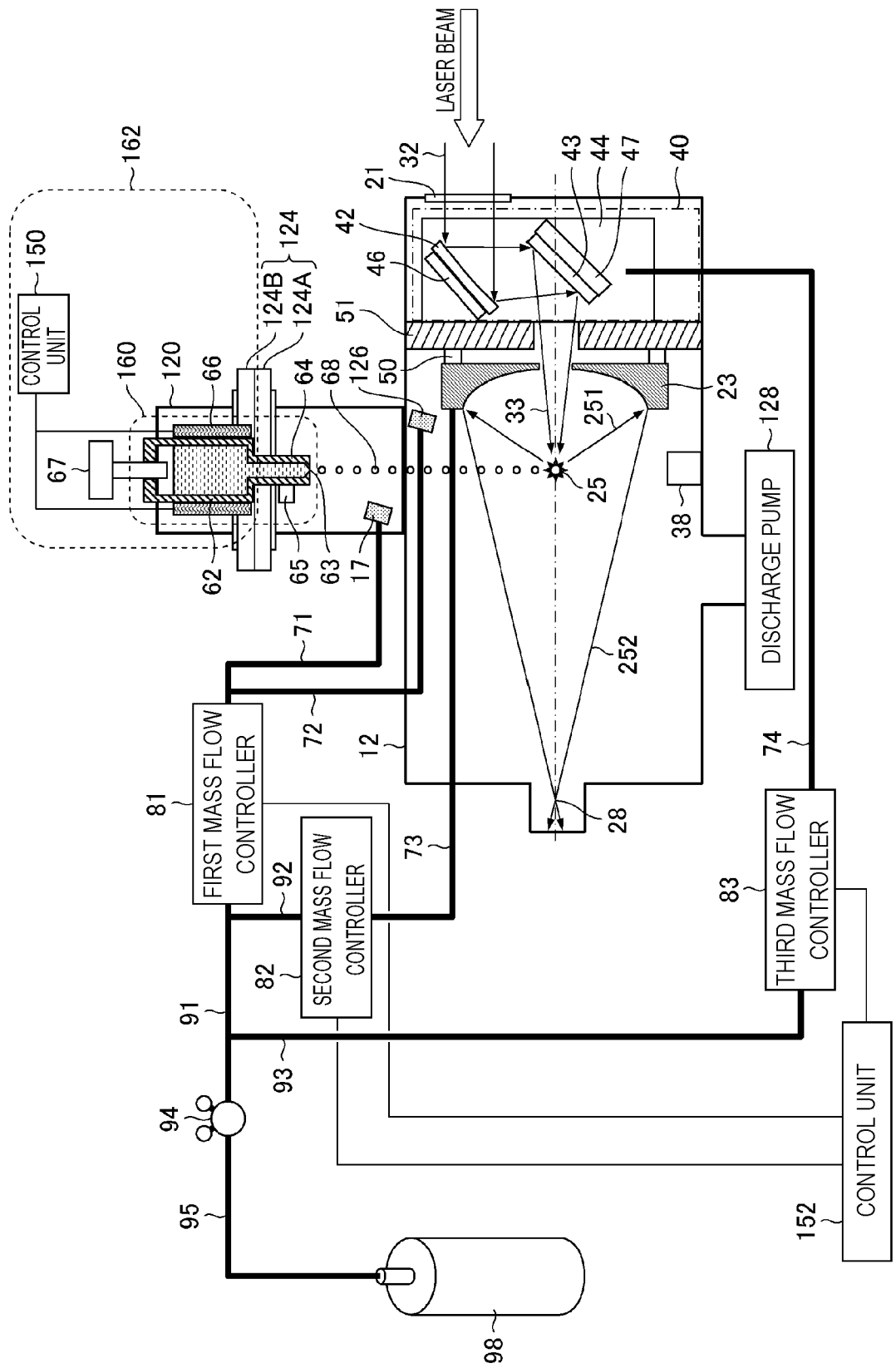
FIG. 2 is a diagram schematically illustrating the configuration of an exemplary EUV light generation apparatus.

FIG. 2 is a diagram schematically illustrating the configuration of an exemplary EUV light generation apparatus. As illustrated in FIG. 2, the chamber 12 includes a laser condensation optical system 40, the EUV condensation mirror 23, an EUV condensation mirror holder 50, a first plate 51, and the target collection unit 38. The EUV condensation mirror 23 is an exemplary "collector mirror".

The first plate 51 is fixed to the inner wall of the chamber 12. The first plate 51 holds the laser condensation optical system 40 and the EUV condensation mirror holder 50. The EUV condensation mirror 23 is held by the EUV condensation mirror holder 50. The EUV condensation mirror holder 50 is fixed to the first plate 51.

The laser condensation optical system 40 condenses, to the plasma generation region 25, a laser beam incident in the chamber 12 through the window 21. The laser condensation optical system 40 may include an off-axis parabolic mirror 42, a planar mirror 43, and a second plate 44. The off-axis parabolic mirror 42 is held by a mirror holder 46. The mirror holder 46 is fixed to the second plate 44. The laser condensation optical system 40 may include a stage (not illustrated). The stage may be, for example, a triaxial stage capable of moving the second plate 44 in the directions of three axes orthogonal to each other.

The planar mirror 43 is held by a mirror holder 47. The mirror holder 47 is fixed to the second plate 44. The second plate 44 is held by the first plate 51. The positions and postures of these mirrors are maintained so that the pulse laser beam 33 reflected by the off-axis parabolic mirror 42 and the planar mirror 43 is condensed to the plasma generation region 25. The off-axis parabolic mirror 42 is an exemplary laser beam condensation mirror 22 described with reference to FIG. 1.

The chamber 12 includes a droplet generator 160, a container 120 housing the droplet generator 160, a biaxial stage 124, an EUV optical sensor 126, and a discharge pump 128. The droplet generator 160 functions as the target supply unit 16 described with reference to FIG. 1. The droplet generator 160 includes a tank 62 storing the target substance, a nozzle 64 including a nozzle hole 63 through which the target substance is output, and a piezoelectric element 65 disposed at the nozzle 64. The droplet generator 160 outputs a droplet 68 formed of the target substance toward the plasma generation region 25 inside the chamber 12.

The tank 62 may be formed in a hollow tubular shape. The target substance is housed inside the hollow tank 62. At least the inside of the tank 62 is made of a material unlikely to react with the target substance. Examples of materials unlikely to react with tin as an exemplary target substance include SiC, $SiO_2$, $Al_2O_3$, molybdenum, tungsten, and tantalum.

The droplet generator 160 includes a temperature adjuster 162. The temperature adjuster 162 includes a heater 66, a control unit 150, and a temperature sensor (not illustrated). The heater 66 is fixed to an outer side surface part of the tank 62. The heater 66 is connected with the control unit 150.

The temperature sensor (not illustrated) is fixed to the outer side surface part of the tank 62. The temperature sensor is connected with the control unit 150. The temperature sensor detects the temperature of the tank 62 and outputs a detection signal to the control unit 150. The control unit 150 can adjust electrical power supplied to the heater 66 based on the detection signal output from the temperature sensor.

In addition, a pressure adjuster 67 is connected with the tank 62. The pressure adjuster 67 is disposed on a pipe between an inert gas supply unit (not illustrated) and the tank 62. The inert gas supply unit may include a gas tank filled with inert gas such as helium or argon. The pressure adjuster 67 can increase or decrease the pressure in the tank 62 by supplying the inert gas into the tank 62 or discharging the inert gas in the tank 62. The pressure in the tank 62 is adjusted to a target pressure by the pressure adjuster 67.

The nozzle 64 is provided at a bottom surface part of the tubular tank 62. One end of the nozzle 64 having a pipe shape is fixed to the hollow tank 62. The nozzle hole 63 is provided at the other end of the nozzle 64 having the pipe shape. Part of the tank 62 on the one end side of the nozzle 64 is positioned outside the chamber 12, and the nozzle hole 63 on the other end side of the nozzle 64 is positioned inside the chamber 12. The insides of the tank 62, the nozzle 64, and the chamber 12 communicate with each other.

The droplet generator 160 is attached to the wall of the chamber 12 through the biaxial stage 124. The biaxial stage 124 includes a first movable plate 124A and a second movable plate 124B and can move the droplet generator 160 in the directions of two axes orthogonal to each other. For example, a Y axial direction is defined to be the direction in which the droplet 68 falls in FIG. 2, a Z axial direction is defined to be the direction in which EUV light is guided from the chamber 12 toward the exposure apparatus 18, and an X axial direction is defined to be a direction orthogonal to the sheet of FIG. 2. In this case, the biaxial stage 124 may move the droplet generator 160 in the X axial direction and the Z axial direction. The position of the droplet generator 160 on an XZ plane can be adjusted by using the biaxial stage 124.

The plasma generation region 25 inside the chamber 12 is positioned on an extended line of the central axis direction of the nozzle 64. The nozzle hole 63 is formed in such a shape that the target substance being melted is ejected into the chamber 12 in a jet form. The target substance output from the nozzle hole 63 may be, for example, liquid tin.

The droplet generator 160 forms droplet 68 by, for example, a continuous jet scheme. In the continuous jet scheme, the nozzle 64 is vibrated to provide periodic vibration (typically, sine wave) to flow of the target ejected in a jet form, thereby periodically separating the target. The separated target forms a free interface by the own surface tension, thereby forming the droplet 68.

The piezoelectric element 65 may be a component of a droplet formation mechanism configured to provide vibration necessary for forming the droplet 68 to the nozzle 64. The piezoelectric element 65 is fixed to an outer side surface part of the nozzle 64.

The droplet generator 160 is fixed to the biaxial stage 124 while being housed in the container 120. The first movable plate 124A is disposed at the biaxial stage 124 on a side closer to the plasma generation region 25, and the second movable plate 124B is disposed on a side farther from the plasma generation region 25 than the first movable plate 124A. The container 120 is fixed to the second movable plate 124B of the biaxial stage 124. The container 120 communicates with the chamber 12 through the biaxial stage 124. The container 120 may be regarded as part of the chamber 12.

The EUV optical sensor 126 is a sensor unit configured to detect EUV light generated in the chamber 12. The EUV optical sensor 126 is connected with the EUV light generation control unit 15.

The EUV optical sensor 126 observes EUV light included in the radiation light 251 radiated from plasma. The energy of EUV light generated in the chamber 12 may be measured by measuring the energy of EUV light radiated from plasma based on a signal obtained from the EUV optical sensor 126.

A plurality of EUV optical sensors 126 may be provided to allow plasma observation at a plurality of positions different from each other. FIG. 2 illustrates one EUV optical sensor 126, but the EUV optical sensors 126 are preferably disposed at a plurality of places around the chamber 12. When a plurality of EUV optical sensors 126 are disposed, the position of plasma can be calculated from the detection position and detection energy of each EUV optical sensor.

The EUV light generation apparatus 10 includes gas introduction pipes 71, 72, 73, and 74 through which gas is introduced into the chamber 12. The gas introduction pipes 71, 72, 73, and 74 are pipes through which gas flows to a place where contamination is desired to be prevented in the chamber 12. Examples of the place where contamination is desired to be prevented include optical elements disposed in the chamber 12, such as the target sensor 17, the EUV optical sensor 126, the EUV condensation mirror 23, and the laser condensation optical system 40. The gas introduction pipe 71 illustrated in FIG. 2 is a pipe through which gas flows to the target sensor 17. The gas introduction pipe 72 is a pipe through which gas flows to the EUV optical sensor 126. The gas introduction pipe 73 is a pipe through which gas flows to the EUV condensation mirror 23. The gas introduction pipe 74 is a pipe through which gas flows to the laser condensation optical system 40.

The EUV light generation apparatus 10 also includes a first mass flow controller 81, a second mass flow controller 82, a third mass flow controller 83, and a control unit 152.

The first mass flow controller 81 is connected with the gas introduction pipes 71 and 72. The second mass flow controller 82 is connected with the gas introduction pipe 73. The third mass flow controller 83 is connected with the gas introduction pipe 74.

The first mass flow controller 81 is connected with a regulator 94 through a gas pipe 91. The second mass flow controller 82 is connected with the regulator 94 through a gas pipe 92. The third mass flow controller 83 is connected with the regulator 94 through a gas pipe 93.

Some or all of the gas pipes 91, 92, and 93 may be included in the configuration of the EUV light generation apparatus 10. The regulator 94 may be included in the configuration of the EUV light generation apparatus 10.

The regulator 94 is connected with a gas supply source 98 through a gas pipe 95. Gas introduced into the chamber 12 is preferably gas that can generate compound gas through reaction with the material of the target substance. When the target substance is tin, the gas introduced into the chamber 12 may be, for example, hydrogen. The gas introduced into the chamber 12 is not limited to hydrogen but may be gas containing hydrogen. Alternatively, the gas introduced into the chamber 12 may be inert gas such as argon gas or helium gas. In this example, tin is used as the target substance and hydrogen is introduced into the chamber 12.

The gas supply source 98 may be a tank filled with high-pressure hydrogen or a cylinder obtained by coupling a plurality of such tanks. Normally, the tank is initially filled with hydrogen at a pressure of 10 MPa or higher.

The first mass flow controller 81, the second mass flow controller 82, and the third mass flow controller 83 are each connected with the control unit 152. The first mass flow controller 81, the second mass flow controller 82, and the third mass flow controller 83 can each change the hydrogen flow rate in accordance with a command from the control unit 152.

The control unit 150 and the control unit 152 are connected with the EUV light generation control unit 15 described with reference to FIG. 1. Alternatively, the control unit 150 and the control unit 152 may be included in the EUV light generation control unit 15. The control unit 150 controls operation of the heater 66 in accordance with a command from the EUV light generation control unit 15. The EUV light generation control unit 15 controls, for example, the output period of the droplet 68 and the speed of the droplet 68 based on a detection signal from the target sensor 17. In addition, the EUV light generation control unit 15 controls the output timing of the pulse laser beam 31 from the laser apparatus 13 based on the detection signal from the target sensor 17.

In the present disclosure, a control device such as the EUV light generation control unit 15, the control unit 150, or the control unit 152 may be achieved by hardware and software combination of one or a plurality of computers. The software is synonymous with a computer program. The computers conceptually include a programmable controller. Part or all of processing functions necessary for control performed by the EUV light generation control unit 15, the control unit 150, or another control device may be achieved by using an integrated circuit such as a field programmable gate array (FPGA) or an application specific integrated circuit (ASIC).

Functions of a plurality of control devices may be achieved by one control device. In addition, in the present disclosure, for example, the EUV light generation control unit 15, the control unit 150, and the control unit 152 may be connected with each other through a communication network such as a local area network or the Internet. In a distributed computing environment, a computer program unit may be stored in both local and remote memory storage devices.

3.2 Operation

The control unit 150 controls the heater 66 based on a detected value of the temperature sensor (not illustrated). For example, when the target substance is tin, the control unit 150 controls the heater 66 so that the temperature of tin in the tank 62 becomes equal to a predetermined temperature equal to or higher than its melting point. As a result, tin in the tank 62 melts. The melting point of tin is 232° C. The predetermined temperature may be, for example, 250° C. to 300° C.

The pressure adjuster 67 adjusts the pressure in the tank 62 under control of the EUV light generation control unit 15 so that the droplet 68 arrives at the plasma generation region 25 at a predetermined speed.

The EUV light generation control unit 15 transfers an electric signal having a predetermined frequency to the piezoelectric element 65 through a piezoelectric power source (not illustrated). The piezoelectric element 65 vibrates based on the electric signal from the piezoelectric power source, thereby vibrating the nozzle 64 at the predetermined frequency. As a result, liquid Sn is output in a jet form from the nozzle hole 63, and the droplet 68 is generated in accordance with the vibration of the nozzle hole 63 by the piezoelectric element 65. The droplet generator 160 can sequentially supply a plurality of droplets 68 at a predetermined speed and a predetermined interval to the plasma generation region 25.

High-pressure hydrogen in the gas supply source 98 is depressurized at the regulator 94. For example, the regulator 94 depressurizes high-pressure hydrogen at 10 MPa to 14 MPa to 0.4 MPa to 0.7 MPa. In accordance with a necessary amount at each use place, hydrogen depressurized at the regulator 94 is introduced into the chamber 12 through the first mass flow controller 81, the second mass flow controller 82, and the third mass flow controller 83 for restricting the flow rate.

The first mass flow controller 81 restricts the flow rate of gas flowing through the gas introduction pipes 71 and 72. The second mass flow controller 82 restricts the flow rate of gas flowing through the gas introduction pipe 73. The third mass flow controller 83 restricts the flow rate of gas flowing through the gas introduction pipe 74. The first mass flow controller 81, the second mass flow controller 82, and the third mass flow controller 83 can each change the flow rate of gas.

Gas having flowed through the first mass flow controller 81 is supplied to the target sensor 17 through the gas introduction pipe 71. Hydrogen having flowed through the second mass flow controller 82 is supplied to the EUV optical sensor 126 through the gas introduction pipe 72.

Gas having flowed through the second mass flow controller 82 is supplied to the EUV condensation mirror 23 through the gas introduction pipe 73. Gas having flowed through the third mass flow controller 83 is supplied to the laser condensation optical system 40 through the gas introduction pipe 74.

Gas introduced into the chamber 12 flows through the entire circumference of each optical element and on the surface of the optical element, and then is discharged out of the chamber 12 by the discharge pump 128. In addition, stannane gas generated through reaction between hydrogen and tin (Sn) is discharged out of the chamber 12 by the discharge pump 128.

The EUV light generation apparatus 10 may include a gas temperature adjuster (not illustrated) for adjusting the temperature of the gas introduced into the chamber 12. The gas temperature adjuster may be disposed on, for example, a gas supply path between the gas supply source 98 and the regulator 94. The gas temperature adjuster can cool gas through adiabatic expansion by cooling the gas at a high-pressure part upstream of the regulator 94. The gas temperature adjuster can set the cooling temperature of gas in accordance with the cooling temperature of each optical element disposed in the chamber 12.

Various optical elements such as the EUV condensation mirror 23 and the laser condensation optical system 40 disposed in the chamber 12 are each adjusted to a target temperature range by using a cooler (not illustrated). For example, the adjustment temperature of each optical element disposed in the chamber 12 may be 20° C. or lower. The adjustment temperature of each optical element disposed in the chamber 12 is preferably 5° C. to 16° C. inclusive. The adjustment temperature of each optical element disposed in the chamber 12 is more preferably 5° C. to 12° C. inclusive.

The adjustment temperature of gas by the gas temperature adjuster is preferably set to be equal to or lower than the adjustment temperature of each optical element disposed in the chamber 12. For example, when the adjustment temperature of each optical element disposed in the chamber 12 is equal to or lower than 16° C., the temperature of the gas introduced into the chamber 12 is preferably equal to or lower than 16° C. When the adjustment temperature of each optical element disposed in the chamber 12 is equal to or lower than 12° C., the temperature of the gas introduced into the chamber 12 is preferably equal to or lower than 12° C.

4. Problems

4.1 Problem 1

When plasma is generated by irradiating the droplet 68 with a laser beam, part of the plasma is generated as particles on the chamber wall surface in accordance with irradiation conditions and environment in the chamber 12 in some cases. When hydrogen gas is rapidly introduced to increase the hydrogen flow rate while the pressure in the chamber 12 is low, particles generated on the chamber wall surface are blown up.

Figure 3:
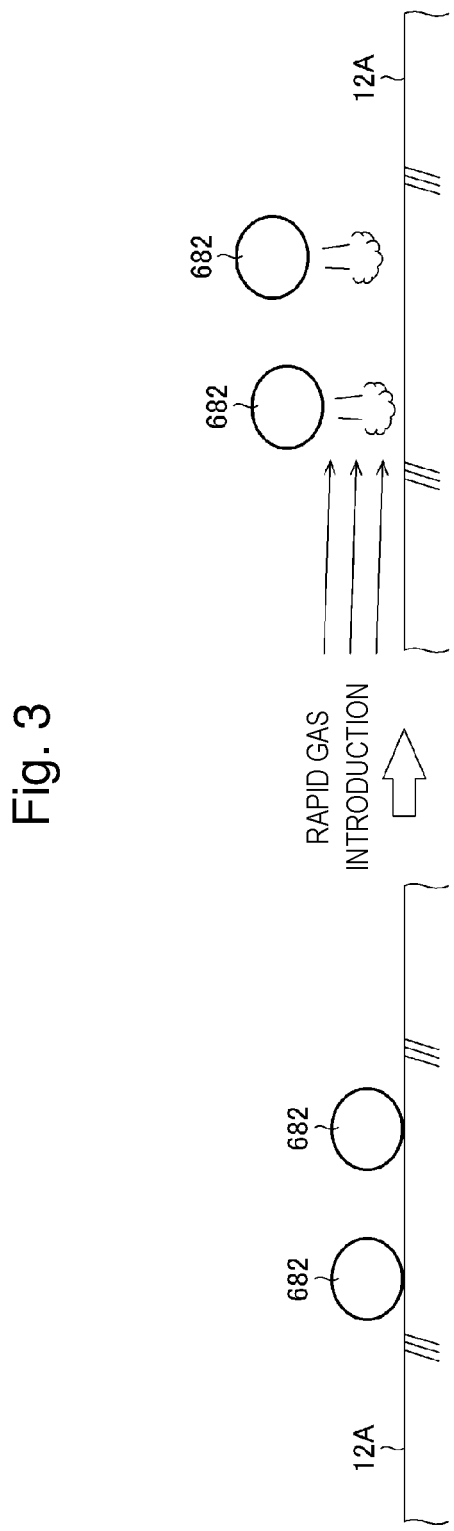
FIG. 3 is an explanatory diagram schematically illustrating a particle blowing-up problem.

FIG. 3 is an explanatory diagram schematically illustrating the particle blowing-up problem. The left diagram in FIG. 3 illustrates a situation in which particles 682 adhere to a chamber wall surface 12A. When hydrogen gas is rapidly introduced into the chamber 12 while the pressure in the chamber 12 is low, the particles 682 can be blown up from the chamber wall surface 12A by the flow of hydrogen gas as illustrated in the right diagram in FIG. 3 and can be scattered into the chamber 12.

The particles 682 blown up from the chamber wall surface 12A adhere to the optical elements such as the laser beam condensation mirror 22 and the EUV condensation mirror 23 in some cases. When the particles 682 adhering to the laser beam condensation mirror 22 and the EUV condensation mirror 23 are irradiated with a high-intensity laser beam or plasma light, the energies of the laser beam and the like are absorbed by the particles 682. Accordingly, the mirrors are heated, which causes mirror damage. As a result, the energy and stability of EUV light decrease.

4.2 Problem 2

When hydrogen is rapidly introduced to the circumference of the droplet generator 160 held at a constant temperature because of the temperature adjuster 162, heat of the droplet generator 160 is absorbed by hydrogen, and the temperature of the droplet generator 160 rapidly and temporarily decreases. Then, the control unit 150 of the temperature adjuster 162 generates heat at the heater 66 of the droplet generator 160 to rapidly increase the temperature, which causes abrupt temperature variation.

Figure 4:
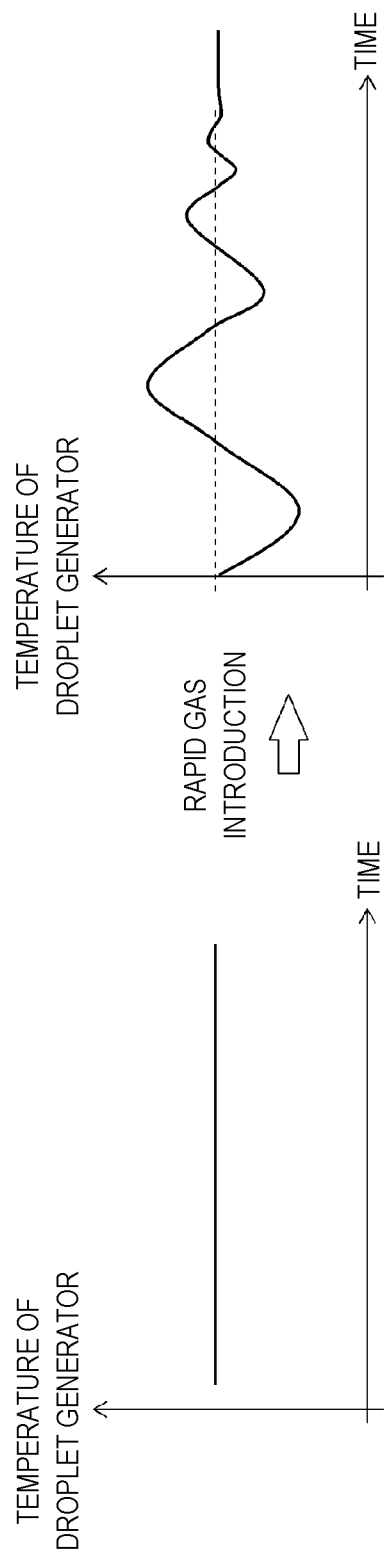
FIG. 4 is an explanatory diagram including a graph indicating a problem of abrupt temperature variation of a droplet generator.

FIG. 4 is an explanatory diagram including a graph indicating the problem of abrupt temperature variation of the droplet generator 160. The left diagram in FIG. 4 is a graph illustrating the temperature of the droplet generator 160 held at a constant temperature. The horizontal axis represents time, and the vertical axis represents temperature. When hydrogen is rapidly introduced into the chamber 12 while the temperature of the droplet generator 160 is held at the constant temperature, the temperature of the droplet generator 160 abruptly changes as illustrated in the right diagram in FIG. 4. The graph illustrated in FIG. 4 can be regarded as a graph illustrating the temperature at and near the nozzle 64 of the droplet generator 160.

Typically, the droplet 68 is generated as the target substance being liquid connects into a predetermined volume through optimum vibration of the piezoelectric element 65. An optimum drive condition of the piezoelectric element 65 for obtaining strong droplet connection differs with temperature. Thus, abrupt temperature variation of the droplet generator 160 causes variation of the optimum drive condition of the piezoelectric element 65, thereby adversely affecting droplet connection. In other words, when hydrogen is rapidly introduced, the temperature at and near the nozzle 64 varies and the optimum drive condition of the piezoelectric element 65 changes, which can result in unstable outputting of EUV light.

4.3 Problem 3

To solve at least one of the above-described problems 1 and 2, the hydrogen flow rate can be initially decreased and then gradually increased while the increase ratio of the hydrogen flow rate is constant. However, it takes time to reach a target hydrogen flow rate in this case.

5. Embodiment 1

5.1 Configuration

Figure 5:
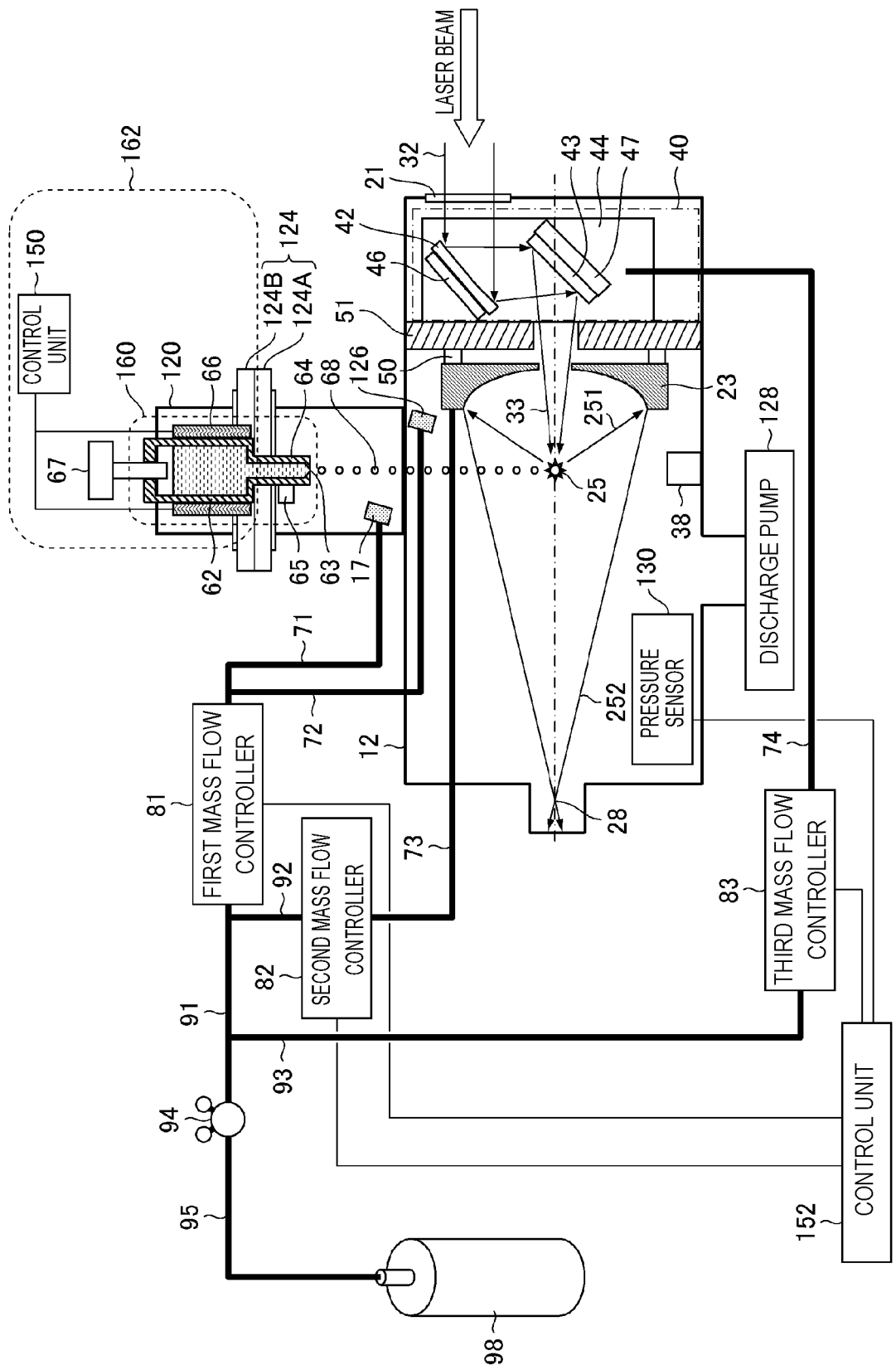
FIG. 5 is a diagram illustrating the configuration of an EUV light generation apparatus according to Embodiment 1.

FIG. 5 is a diagram illustrating the configuration of an EUV light generation apparatus according to Embodiment 1. The following describes difference from the configuration illustrated in FIG. 2. In the EUV light generation apparatus 10 illustrated in FIG. 5, a pressure sensor 130 is disposed inside the chamber 12. The pressure sensor 130 is connected with the control unit 152.

5.2 Operation

The pressure sensor 130 monitors the pressure in the chamber 12. In the "pressure monitoring", the pressure is measured continuously or intermittently at a predetermined time interval.

The control unit 152 can change the increase ratio of the hydrogen flow rate in accordance with a pressure value in the chamber 12, which is obtained from the pressure sensor 130. The control unit 152 increases the increase ratio of the hydrogen flow rate as the pressure in the chamber 12 increases.

Figure 6:
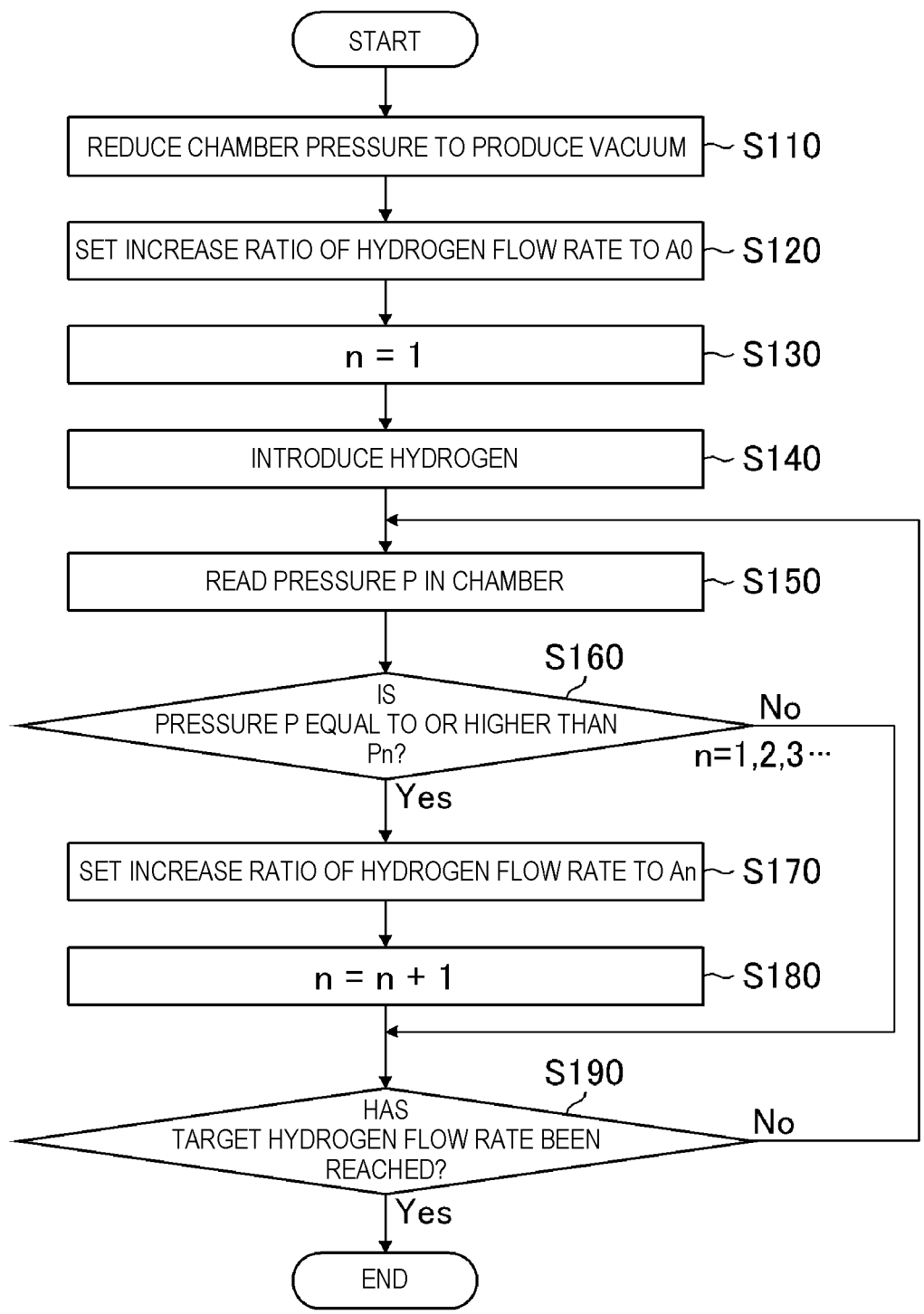
FIG. 6 is a flowchart related to gas supply control at the EUV light generation apparatus according to Embodiment 1.

FIG. 6 is a flowchart related to gas supply control at the EUV light generation apparatus according to Embodiment 1. At step S110, the control unit 152 reduces the pressure in the chamber 12 to produce a vacuum state. The control unit 152 operates the discharge pump 128 to perform depressurization in the chamber 12, thereby producing the vacuum state. For example, a state at the pressure of several Pa to several hundred Pa may be included in the "vacuum state". The discharge pump 128 is continuously driven at a constant rotation speed at step S110 and later. The amount of discharge by the discharge pump 128 is constant.

At step S120, the control unit 152 sets the increase ratio of the hydrogen flow rate to A0. The increase ratio of the hydrogen flow rate is a flow rate increase amount per unit time. The value A0 is a predetermined initial set value.

At step S130, the control unit 152 sets the initial value of "1" to a control parameter n for changing the increase ratio of the hydrogen flow rate at stages. The words "at stages" may be replaced with "discretely".

At step S140, the control unit 152 introduces hydrogen into the chamber 12. The control unit 152 introduces hydrogen into the chamber 12 by causing hydrogen to flow through at least one of the first mass flow controller 81, the second mass flow controller 82, and the third mass flow controller 83.

At step S150, the control unit 152 reads pressure P in the chamber 12. The control unit 152 acquires information of the pressure P from the pressure sensor 130.

At step S160, the control unit 152 determines whether the pressure P is equal to or higher than a determination reference value Pn. The value "n" in "Pn" is an index indicating a stage number when the increase ratio of the hydrogen flow rate is changed at stages, and has the value of the control parameter n. When the increase ratio of the hydrogen flow rate is changed at (N+1) stages from A0 to AN, n is an integer of 1 to N (n=1, 2, 3, . . . , N).

When the determination at step S160 is negative, in other words, when the pressure P is lower than the determination reference value Pn, the control unit 152 proceeds to step S190.

At step S190, the control unit 152 determines whether the hydrogen flow rate has reached a target hydrogen flow rate. The target hydrogen flow rate is a predetermined target value of the hydrogen flow rate. When the determination at step S190 is negative, in other words, when the hydrogen flow rate has not reached the target hydrogen flow rate, the control unit 152 returns to step S150.

When the determination at step S160 is positive, in other words, when the pressure P has become equal to or higher than the determination reference value Pn, the control unit 152 proceeds to step S170.

The determination reference value Pn satisfies the relation "P1<P2< . . . <PN" and increases as n increases. In other words, the sequence of Pn is a monotonically increasing sequence in which "Pn1<Pn2" is satisfied for "n1<n2".

At step S170, the control unit 152 sets the increase ratio of the hydrogen flow rate to An. The increase ratio An of the hydrogen flow rate satisfies the relation "A0<A1<A2< . . . <AN" and increases as n increases. In other words, the sequence of An is a monotonically increasing sequence in which An1<An2 is satisfied for n1<n2.

At step S180, the control unit 152 increments the control parameter n by "+1" and sets the value "n+1" as a new value of n.

After step S180, the control unit 152 proceeds to step S190.

The processing at steps S150 to S190 is repeated. Accordingly, the increase ratio of the hydrogen flow rate increases from "A0" to "A1" to "A2" . . . "AN" at stages as the pressure P increases. The hydrogen flow rate eventually reaches the target hydrogen flow rate.

When the determination at step S190 is positive, in other words, when the hydrogen flow rate has reached the target hydrogen flow rate, the control unit 152 ends the flowchart in FIG. 6.

Figure 7:
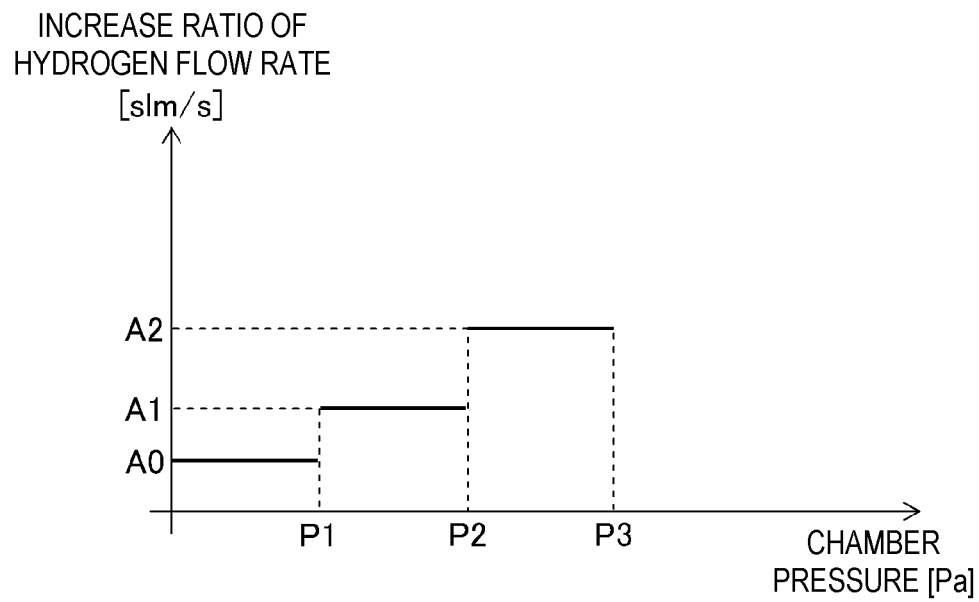
FIG. 7 is a graph exemplarily indicating the relation between the increase ratio of the hydrogen flow rate and the chamber pressure.

FIG. 7 is a graph exemplarily indicating the relation between the increase ratio of the hydrogen flow rate and the chamber pressure. The horizontal axis represents the chamber pressure, and the vertical axis represents the increase ratio of the hydrogen flow rate. The unit of the pressure is pascal [Pa], and the unit of the increase ratio of the hydrogen flow rate is, for example, [slm/s]. Here, "slm" stands for "standard liter/min" and indicates the flow rate in liter per minute at one atmospheric pressure [atm] and 0° C. The chamber pressure is the pressure in the chamber 12, and may be a pressure value measured by the pressure sensor 130.

FIG. 7 illustrates an example in which the increase ratio of the hydrogen flow rate is increased at stages of three change steps of "A0" to "A1" to "A2". The increase ratio of the hydrogen flow rate is desirably increased at stages of three change steps or more.

Figure 8:
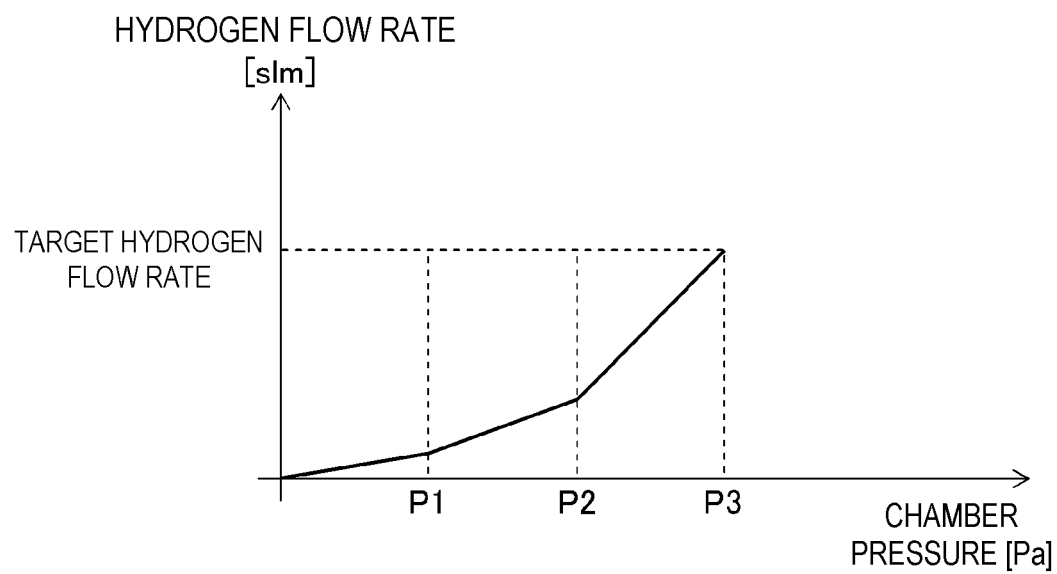
FIG. 8 is a graph exemplarily indicating the relation between the hydrogen flow rate and chamber pressure.

FIG. 8 is a graph exemplarily indicating the relation between the hydrogen flow rate and the chamber pressure. The horizontal axis represents the chamber pressure [Pa], and the vertical axis represents the increase ratio of the hydrogen flow rate [slm/s].

In the graphs illustrated in FIGS. 7 and 8, examples of specific numerical values are P1=5 [Pa], P2=10 [Pa], P3=20 [Pa], A0=0.1 [slm/s], A1=0.2 [slm/s], and A2=1.0 [slm/s].

Although not illustrated in FIGS. 7 and 8, A3 may be 5.0 [slm/s] for pressure higher than P3.

P1 is exemplary "first pressure". P2 is exemplary "second pressure". P3 is exemplary "third pressure". In this case, the increase ratio A1 of the hydrogen flow rate applied between P1 and P2 is an exemplary "first increase ratio", and the increase ratio A2 of the hydrogen flow rate applied between P2 and P3 is an exemplary "second increase ratio".

Alternatively, when P0 represents the initial pressure at the start of hydrogen introduction, P0 corresponds to the "first pressure", P1 corresponds to the "second pressure", and P2 corresponds to the "third pressure". In this case, A0 corresponds to the "first increase ratio", and A1 corresponds to the "second increase ratio".

The initial flow rate increase ratio A0 desirably satisfies 0.05 [slm/s]≤A0≤1.0 [slm/s], more desirably 0.1 [slm/s]≤A0≤0.5 [slm/s].

The initial flow rate increase ratio A0 is desirably equal to or lower than ⅕ of the increase ratio AN (in FIG. 7, A2) at the last stage of increase of the increase ratio of the hydrogen flow rate. The initial flow rate increase ratio A0 is more desirably equal to or lower than 1/20 of the increase ratio AN at the last stage.

Figure 9:
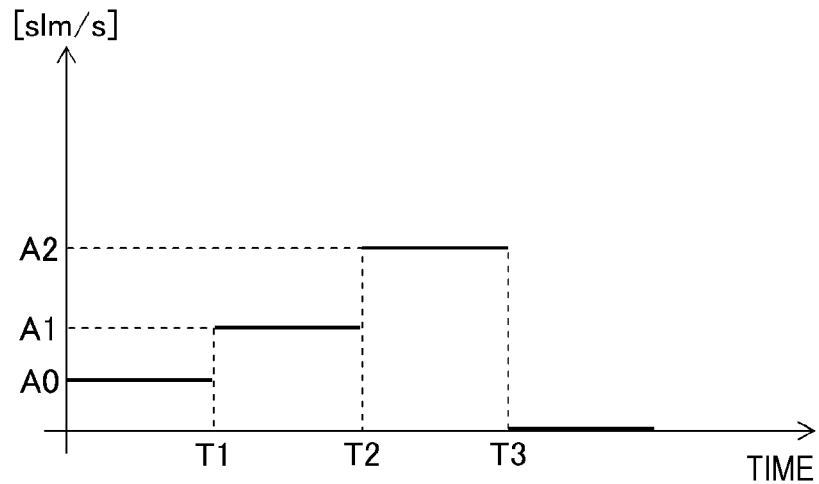
FIG. 9 is a graph exemplarily indicating the relation between the increase ratio of the hydrogen flow rate and time.
Figure 10:
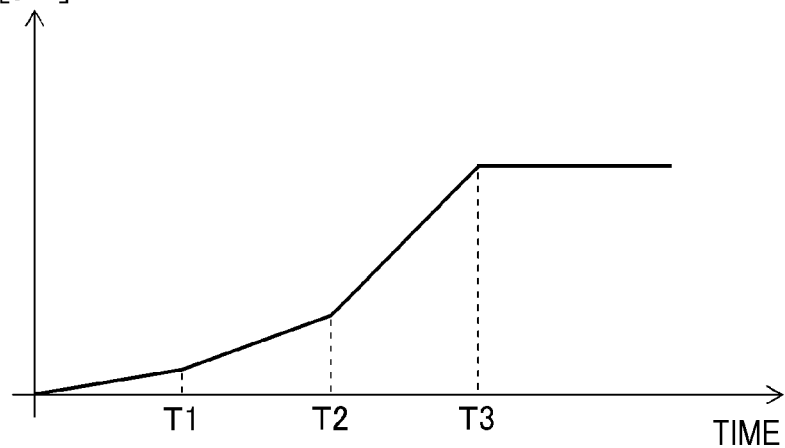
FIG. 10 is a graph exemplarily indicating the relation between the hydrogen flow rate and time.

When Tn represents the time at which the pressure P in the chamber has reached the pressure Pn, FIGS. 7 and 8 can be illustrated as FIGS. 9 and 10, respectively. In FIG. 9, the horizontal axis represents time, and the vertical axis represents the increase ratio of the hydrogen flow rate. In FIG. 10, the horizontal axis represents time, and the vertical axis represents the hydrogen flow rate.

Figure 11:
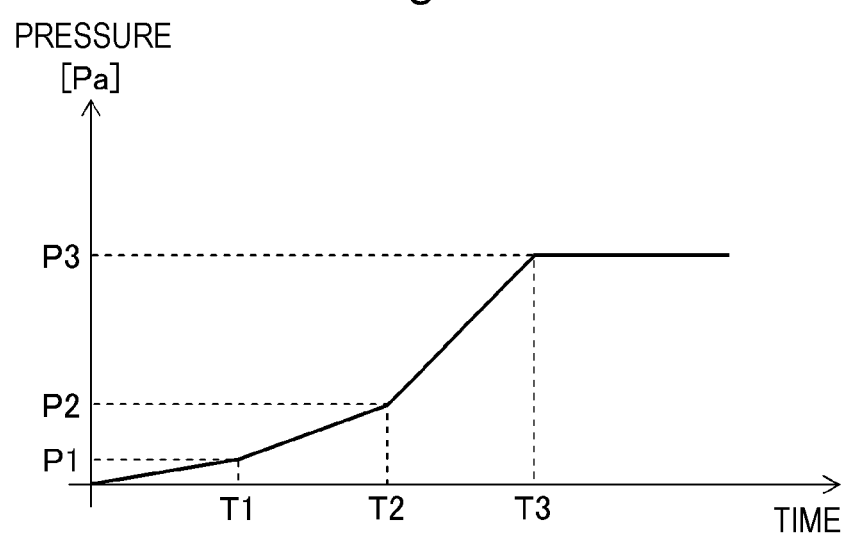
FIG. 11 is a graph indicating the relation between the pressure and time, which is achieved by controlling the increase ratio of the hydrogen flow rate exemplarily illustrated in FIG. 9.

FIG. 11 is a graph indicating the relation between the pressure and time, which is achieved by controlling the increase ratio of the hydrogen flow rate exemplarily illustrated in FIG. 9.

5.3 Effect According to Embodiment 1, effects as follows are obtained.

(1) When the pressure in the chamber 12 is sufficiently low, the hydrogen flow rate can be maintained low by decreasing the increase ratio of the hydrogen flow rate, which can prevent the particle blowing-up.

(2) Abrupt temperature variation of the droplet generator 160 can be reduced by decreasing the increase ratio of the hydrogen flow rate as compared to a case in which hydrogen is rapidly introduced.

(3) A time taken to reach the target hydrogen flow rate can be reduced by increasing the increase ratio of the hydrogen flow rate as the pressure in the chamber 12 increases.

5.4 Modification FIG. 5 exemplarily illustrates the configuration of the EUV light generation apparatus 10 including the first mass flow controller 81, the second mass flow controller 82, and the third mass flow controller 83, but the number of mass flow controllers is not particularly limited. The EUV light generation apparatus 10 needs to include at least one mass flow controller.

6. Embodiment 2

6.1 Configuration

The configuration of an EUV light generation apparatus according to Embodiment 2 is same as that in Embodiment 1.

6.2 Operation

Figure 12:
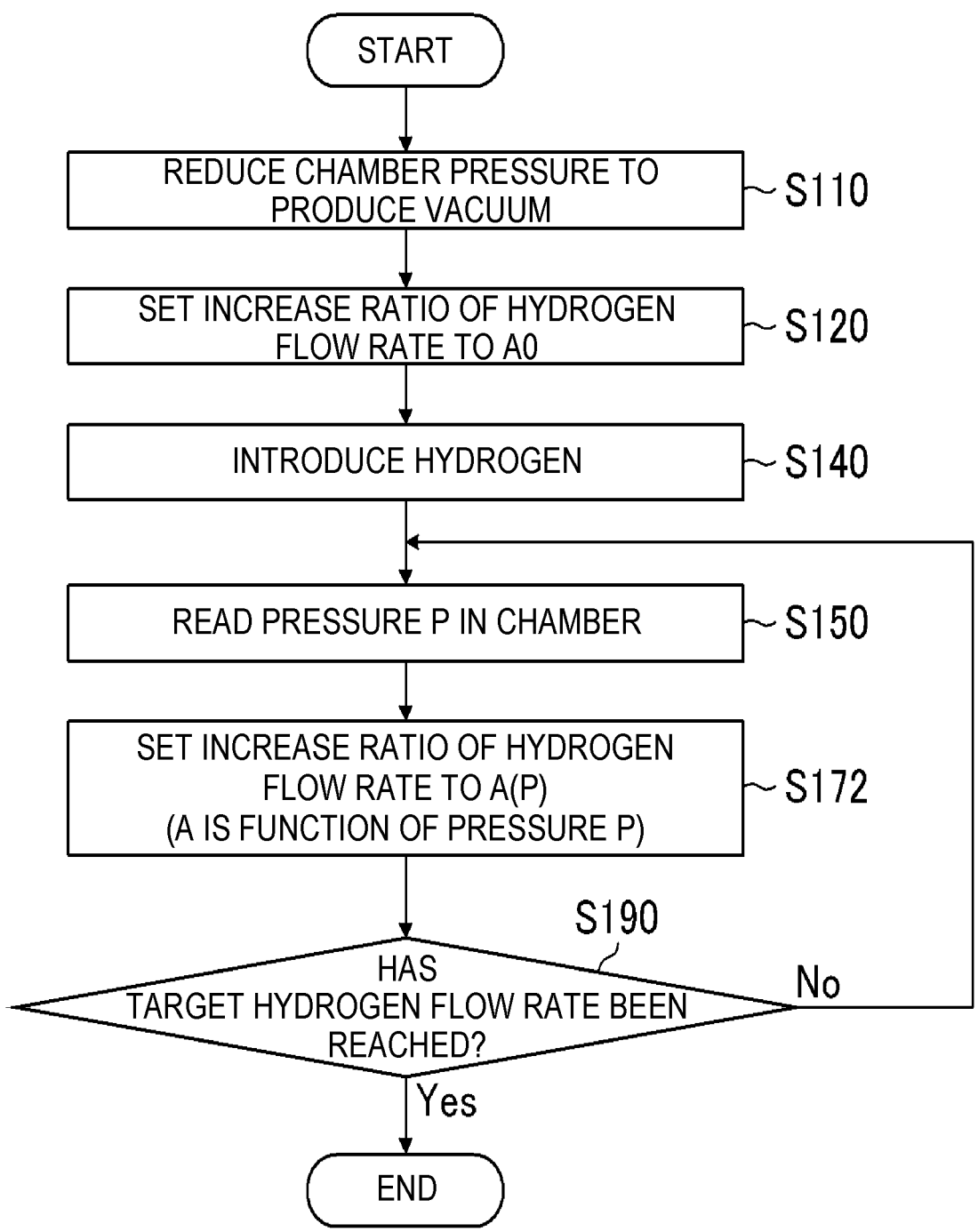
FIG. 12 is a flowchart related to gas supply control at an EUV light generation apparatus according to Embodiment 2.

FIG. 12 is a flowchart related to gas supply control at the EUV light generation apparatus according to Embodiment 2. In FIG. 12, each step identical to that of the flowchart illustrated in FIG. 6 is denoted by an identical step number, and thus description thereof will be omitted. The following describes difference from FIG. 6.

As the chamber pressure increases, the increase ratio of the hydrogen flow rate discretely (at stages) increases in Embodiment 1, but in Embodiment 2, the increase ratio of the hydrogen flow rate continuously increases in accordance with a pressure function, which is a difference. Specifically, in Embodiment 2, the increase ratio of the hydrogen flow rate gradually (continuously) increases in accordance with the pressure in the chamber 12. The increase ratio of the hydrogen flow rate is determined by a function having the pressure as a variable.

The flowchart illustrated in FIG. 12 does not include steps S130, S160, and S180 in the flowchart illustrated in FIG. 6, but includes step S172 in place of step S170.

At step S172, the control unit 152 sets the increase ratio of the hydrogen flow rate to A(P). The increase ratio A of the hydrogen flow rate is a function of the pressure P and expressed as "A(P)". The control unit 152 can determine the increase ratio of the hydrogen flow rate by using an expression indicating a determined function or a look-up table corresponding to the function.

Figure 13:
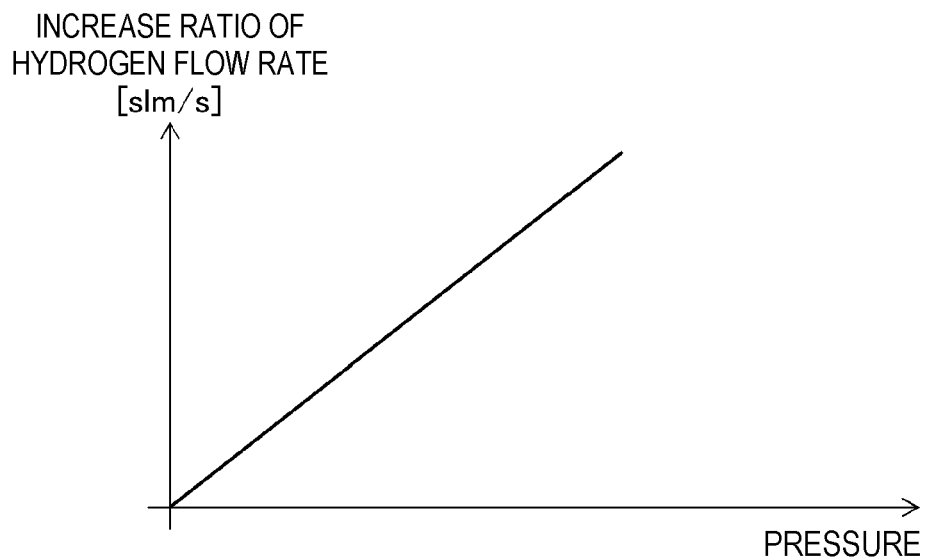
FIG. 13 is a graph illustrating an exemplary relation between the increase ratio of the hydrogen flow rate and the pressure.

FIG. 13 is a graph illustrating an exemplary relation between the increase ratio of the hydrogen flow rate and the pressure. FIG. 13 illustrates an example in which the increase ratio of the hydrogen flow rate is expressed by a pressure linear function. In FIG. 13, the horizontal axis represents the pressure, and the vertical axis represents the increase ratio of the hydrogen flow rate.

Figure 14:
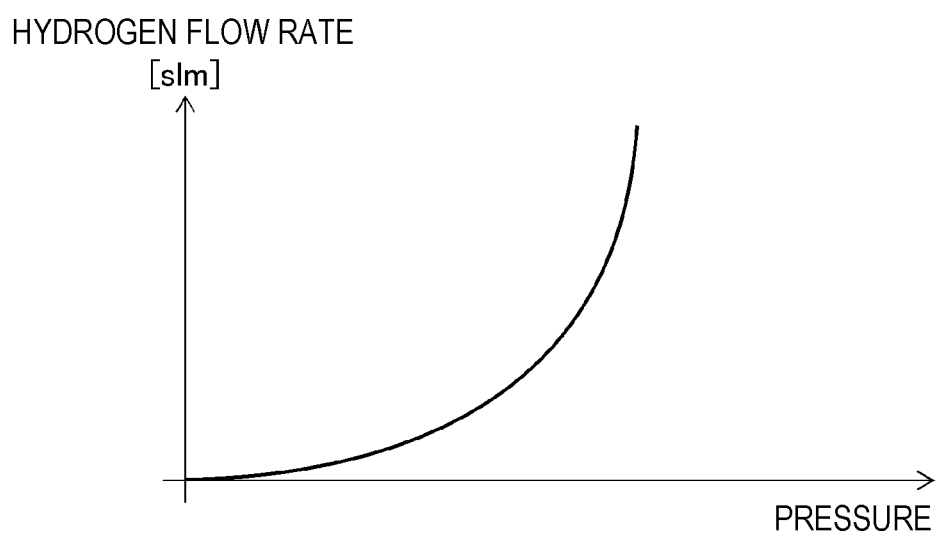
FIG. 14 is a graph indicating the relation between the hydrogen flow rate and the pressure, which is achieved when the increase ratio of the hydrogen flow rate is controlled in accordance with a function illustrated in FIG. 13.

FIG. 14 is a graph indicating the relation between the hydrogen flow rate and the pressure, which is achieved when the increase ratio of the hydrogen flow rate is controlled in accordance with the function illustrated in FIG. 13.

Figure 15:
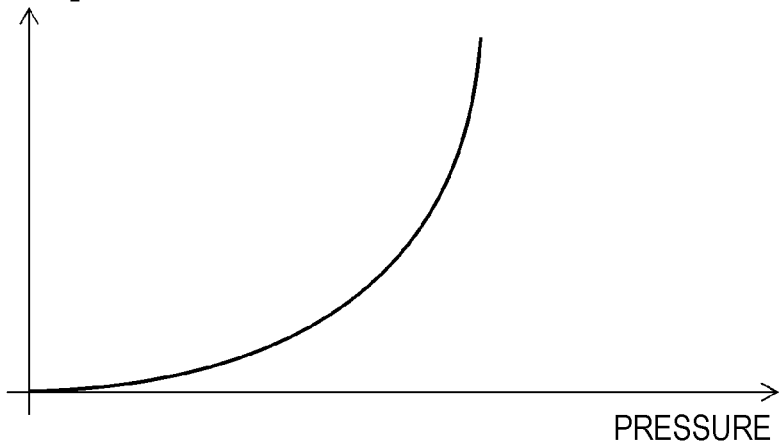
FIG. 15 is a graph illustrating another exemplary relation between the increase ratio of the hydrogen flow rate and the pressure.

FIG. 15 is a graph illustrating another exemplary relation between the increase ratio of the hydrogen flow rate and the pressure. FIG. 15 illustrates an example in which the increase ratio of the hydrogen flow rate is expressed by a pressure function of a downwardly convex graph. In FIG. 15, the horizontal axis represents the pressure, and the vertical axis represents the increase ratio of the hydrogen flow rate.

Figure 16:
FIG. 16 is a graph indicating the relation between the hydrogen flow rate and the pressure, which is achieved when the increase ratio of the hydrogen flow rate is controlled in accordance with a function illustrated in FIG. 15.

FIG. 16 is a graph indicating the relation between the hydrogen flow rate and the pressure, which is achieved when the increase ratio of the hydrogen flow rate is controlled in accordance with the function illustrated in FIG. 15.

In application of the present invention, the function of the increase ratio of the hydrogen flow rate, which has the pressure as a variable, preferably illustrates a downwardly convex graph, in other words, is preferably a monotonically increasing function having a positive second order differential. The linear function exemplarily illustrated in FIG. 13 is a function having a second order differential of zero. Thus, the function of the increase ratio of the hydrogen flow rate, which has the pressure as a variable, is preferably a function having a second order differential equal to or larger than zero.

The function may be any function satisfying such a condition and may have any specific form. The function may be a polynomial function such as a third order function or a fourth order function or may be an exponential function.

6.3 Effect

According to Embodiment 2, effects same as those of Embodiment 1 can be obtained.

7. Embodiment 3

7.1 Configuration

Figure 17:
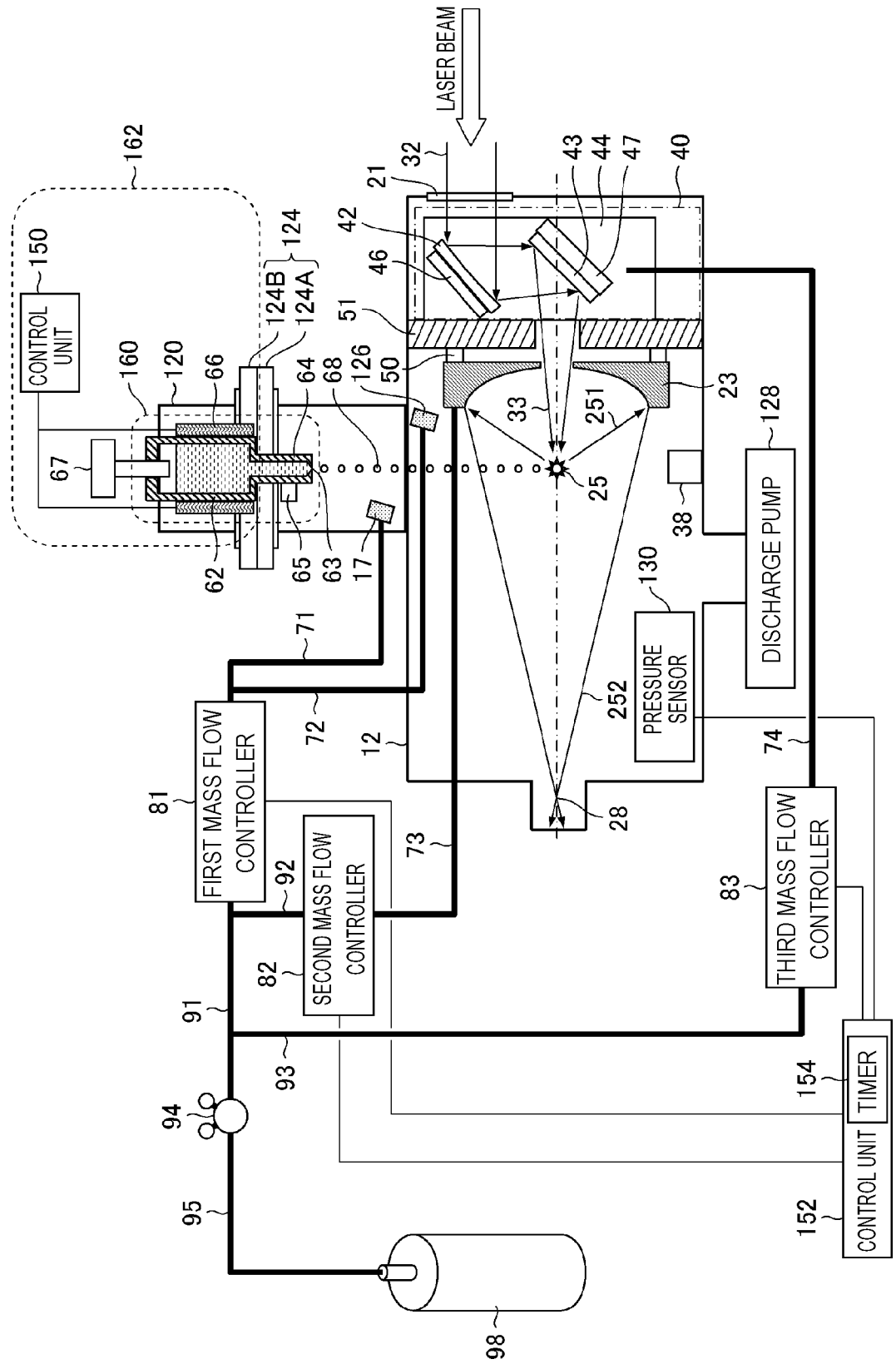
FIG. 17 is a diagram illustrating the configuration of an EUV light generation apparatus according to Embodiment 3.

FIG. 17 is a diagram illustrating the configuration of an EUV light generation apparatus according to Embodiment 3. The following describes difference from Embodiment 1 illustrated in FIG. 5. The control unit 152 includes a timer 154. The timer 154 measures an elapsed time since the start of gas introduction into the chamber 12. The timer 154 may be provided outside the control unit 152.

7.2 Operation

The EUV light generation apparatus according to Embodiment 3 is different from that of Embodiment 1 in that the increase ratio of the hydrogen flow rate is changed not in accordance with the "pressure P" but in accordance with "time" since hydrogen introduction. In the EUV light generation apparatus according to Embodiment 3, the increase ratio of the hydrogen flow rate discretely increases in accordance with the elapsed time since hydrogen introduction.

Figure 18:
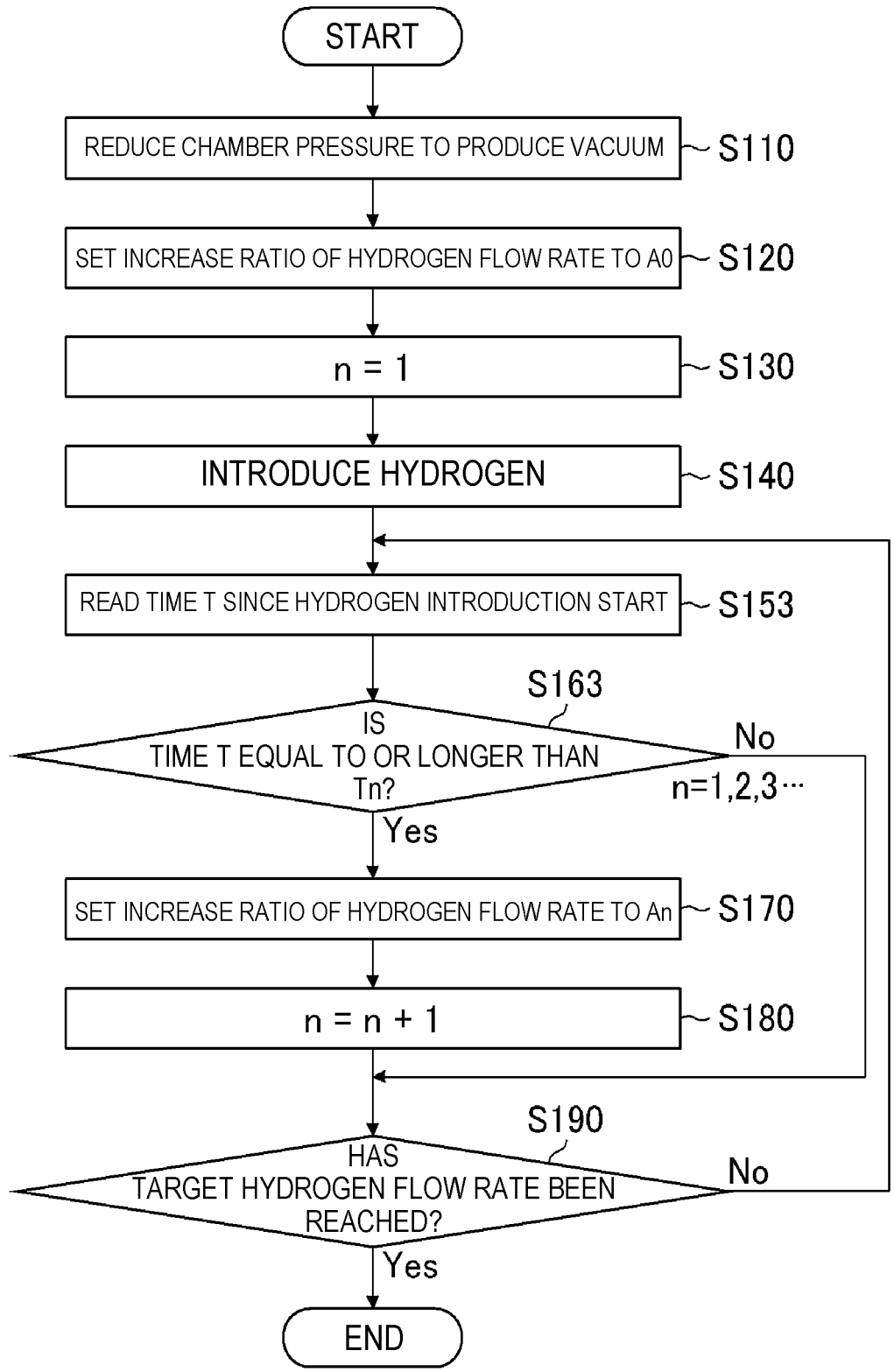
FIG. 18 is a flowchart related to gas supply control at the EUV light generation apparatus according to Embodiment 3.

FIG. 18 is a flowchart related to gas supply control at the EUV light generation apparatus according to Embodiment 3. In FIG. 18, each step identical to that of the flowchart illustrated in FIG. 6 is denoted by an identical step number, and thus description thereof will be omitted. The following describes difference from FIG. 6.

The flowchart illustrated in FIG. 18 includes steps S153 and S163 in place of steps S150 and S160 in the flowchart illustrated in FIG. 6.

At step S153, the control unit 152 reads a time T since the start of hydrogen introduction. The control unit 152 obtains information of the time T from the timer 154.

At step S163, the control unit 152 determines whether the time T is equal to or longer than a determination reference value Tn. When the determination at step S163 is negative, in other words, when the time T is shorter than the determination reference value Tn, the control unit 152 proceeds to step S190.

When the determination at step S163 is positive, in other words, when the time T has become equal to or longer than the determination reference value Tn, the control unit 152 proceeds to step S170.

The determination reference value Tn satisfies the relation "T1<T2< . . . <TN" as illustrated in FIG. 11 and increases as n increases. In other words, the sequence of Tn is a monotonically increasing sequence in which Tn1<Tn2 is satisfied for n1<n2.

FIG. 19 is an explanatory diagram including a graph exemplarily indicating the relation between the time and each of the increase ratio of the hydrogen flow rate, the hydrogen flow rate, and the pressure. The graph at the uppermost part of FIG. 19 illustrates the relation between the increase ratio of the hydrogen flow rate and time. In this graph, the horizontal axis represents time, and the vertical axis represents the pressure. The graph at the middle part of FIG. 19 illustrates the relation between the hydrogen flow rate and time. In this graph, the horizontal axis represents the time, and the vertical axis represents the hydrogen flow rate. The graph at the lowermost part of FIG. 19 illustrates the relation between the pressure and time. In this graph, the horizontal axis represents time, and the vertical axis represents the pressure.

T1 is an exemplary "first time". T2 is an exemplary "second time". T3 is an exemplary "third time". In this case, the increase ratio A1 of the hydrogen flow rate, which is applied between T1 and T2 is an exemplary "first increase ratio", and the increase ratio A2 of the hydrogen flow rate, which is applied between T2 and T3 is an exemplary "second increase ratio".

Alternatively, when T0 represents time at the start of hydrogen introduction, T0 corresponds to the "first time", T1 corresponds to the "second time", and T2 corresponds to the "third time". In this case, A0 corresponds to the "first increase ratio", and A1 corresponds to the "second increase ratio".

7.3 Effect

According to Embodiment 3, effects same as those of Embodiment 1 can be obtained.

8. Embodiment 4

8.1 Configuration

The configuration of an EUV light generation apparatus according to Embodiment 4 is same as the configuration of the EUV light generation apparatus according to Embodiment 3 illustrated in FIG. 17.

8.2 Operation

In Embodiment 3, the increase ratio of the hydrogen flow rate discretely (at stages) increases as the time since hydrogen introduction elapses. However, in Embodiment 4, the increase ratio of the hydrogen flow rate continuously increases in accordance with a function of the time, which is a difference. Specifically, this difference from Embodiment 3 is such that the increase ratio of the hydrogen flow rate gradually (continuously) changes in accordance with the time since hydrogen introduction. The increase ratio of the hydrogen flow rate is determined by a function having the time since the start of hydrogen introduction as a variable.

Figure 20:
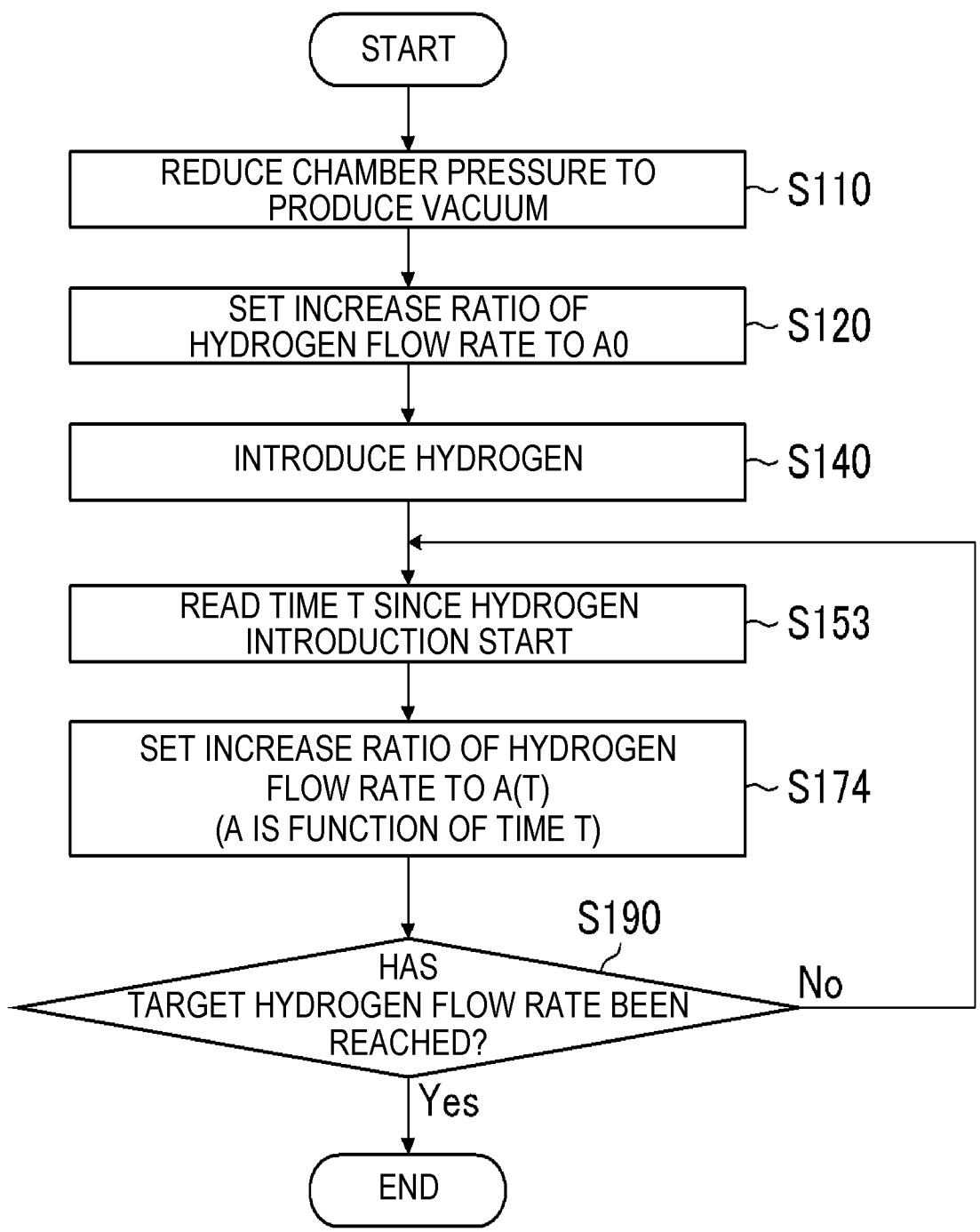
FIG. 20 is a flowchart related to gas supply control at an EUV light generation apparatus according to Embodiment 4.

FIG. 20 is a flowchart related to gas supply control at the EUV light generation apparatus according to Embodiment 4. In FIG. 20, each step identical to that of the flowchart illustrated in FIG. 18 is denoted by an identical step number, and thus description thereof will be omitted. The following describes difference from FIG. 18.

The flowchart illustrated in FIG. 20 does not include steps S130, S163, and S180 in the flowchart illustrated in FIG. 18, but includes step S174 in place of step S170.

At step S153, the control unit 152 reads the time T since the start of hydrogen introduction. The control unit 152 obtains information of the time T from the timer.

At step S174, the control unit 152 sets the increase ratio of the hydrogen flow rate to A(T). The increase ratio A of the hydrogen flow rate is a function of the time T and expressed as "A(T)". The control unit 152 can determine the increase ratio of the hydrogen flow rate by using an expression indicating a determined function or a look-up table corresponding to the function.

Figure 21:
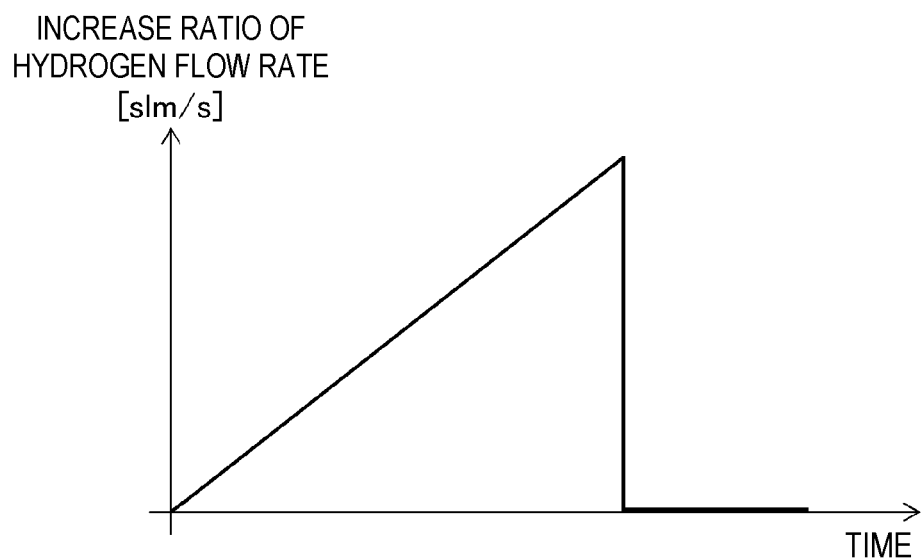
FIG. 21 is a graph illustrating an exemplary relation between the increase ratio of the hydrogen flow rate and time.

FIG. 21 is a graph illustrating an exemplary relation between the increase ratio of the hydrogen flow rate and time. FIG. 21 illustrates an example in which the increase ratio of the hydrogen flow rate is expressed by a time linear function. In FIG. 21, the horizontal axis represents time, and the vertical axis represents the increase ratio of the hydrogen flow rate.

Figure 22:
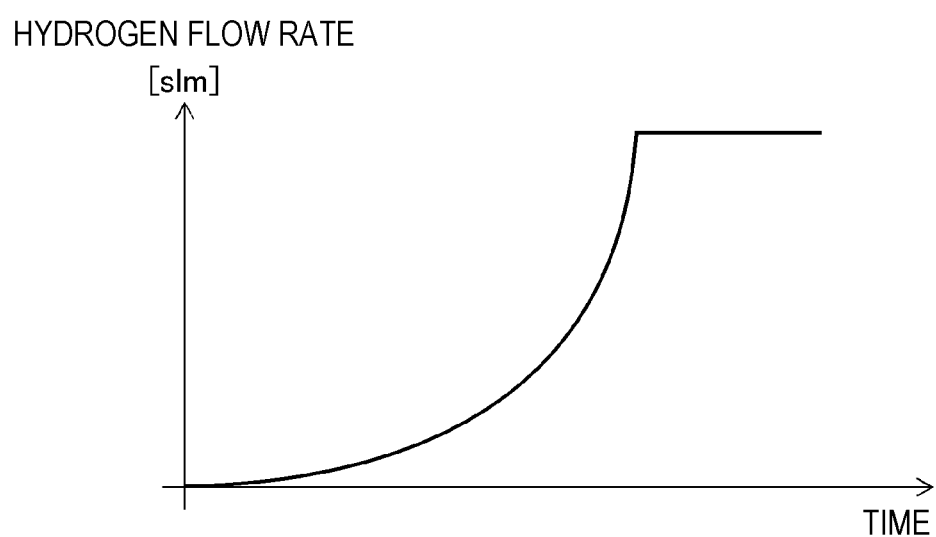
FIG. 22 is a graph indicating the relation between the hydrogen flow rate and time, which is achieved when the increase ratio of the hydrogen flow rate is controlled in accordance with a function illustrated in FIG. 21.

FIG. 22 is a graph indicating the relation between the hydrogen flow rate and time, which is achieved when the increase ratio of the hydrogen flow rate is controlled in accordance with the function illustrated in FIG. 21. Although not illustrated in FIG. 22, the function of the increase ratio of the hydrogen flow rate, which has the time as a variable, may be a monotonically increasing function having a positive second order differential. The function of the increase ratio of the hydrogen flow rate, which has the time as a variable, preferably has a second order differential equal to or larger than zero.

8.3 Effect

According to Embodiment 4, effects same as those of Embodiment 1 can be obtained.

9. Embodiment 5

9.1 Configuration

The configuration of an EUV light generation apparatus according to Embodiment 5 may be same as the configuration of the EUV light generation apparatus according to Embodiment 3 illustrated in FIG. 17.

9.2 Operation

FIG. 23 is an explanatory diagram including a graph indicating the relation between the increase ratio of the hydrogen flow rate at each mass flow controller in the EUV light generation apparatus according to Embodiment 5 and time. The graph at the uppermost part of FIG. 23 illustrates the relation between the increase ratio of the hydrogen flow rate at the first mass flow controller 81 and time. The graph at the middle part of FIG. 23 illustrates the relation between the increase ratio of the hydrogen flow rate at the second mass flow controller 82 and time. The graph at the lowermost part of FIG. 23 illustrates the relation between the increase ratio of the hydrogen flow rate at the third mass flow controller 83 and time. Although the horizontal axis represents time in FIG. 23, the graph can be redrawn by converting the horizontal axis into "pressure" similarly to Embodiment 1.

In Embodiment 5, control is performed to increase the increase ratio of the hydrogen flow rate at each of the first mass flow controller 81, the second mass flow controller 82, and the third mass flow controller 83 in the stated order.

The control unit 152 controls the first mass flow controller 81, the second mass flow controller 82, and the third mass flow controller 83 to increase the increase ratio of the total flow rate of hydrogen entering the chamber 12 as time measured by the timer 154 elapses.

Alternatively, the control unit 152 controls the first mass flow controller 81, the second mass flow controller 82, and the third mass flow controller 83 to increase the increase ratio of the total flow rate of hydrogen entering the chamber 12 as pressure acquired by the pressure sensor 130 increases.

As illustrated in FIG. 23, for the duration from the start of hydrogen introduction to time T2, hydrogen is introduced into the chamber 12 through the first mass flow controller 81. For the duration from time T2 to time T4, hydrogen is introduced into the chamber 12 through the first mass flow controller 81 and the second mass flow controller 82. For the duration after time T4, hydrogen is introduced into the chamber 12 through the first mass flow controller 81, the second mass flow controller 82, and the third mass flow controller 83.

As illustrated in FIG. 23, the increase ratio of the hydrogen flow rate is increased for each of the first mass flow controller 81, the second mass flow controller 82, and the third mass flow controller 83 as time elapses or the pressure increases since the start of hydrogen introduction.

Figure 24:
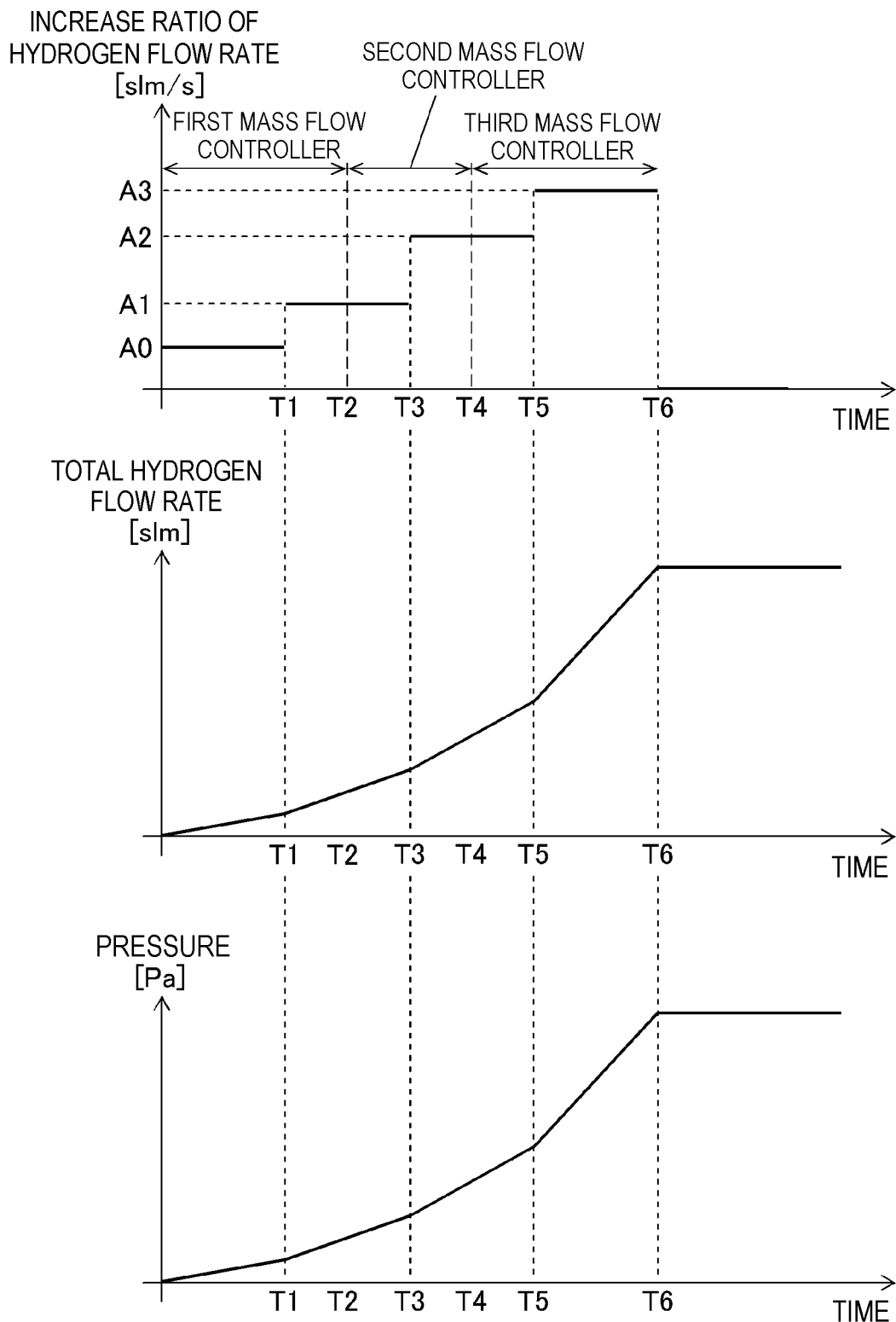
FIG. 24 is an explanatory diagram including a graph indicating the relation between time and each of the increase ratio of the hydrogen flow rate as the entire combination of operation of a plurality of mass flow controllers, the total hydrogen flow rate, and the pressure in the EUV light generation apparatus according to Embodiment 5.

FIG. 24 is an explanatory diagram including a graph indicating the relation between time and each of the increase ratio of the hydrogen flow rate as the entire combination of operation of the mass flow controllers in the EUV light generation apparatus according to Embodiment 5, the total hydrogen flow rate, and the pressure. The graph at the uppermost part of FIG. 24 illustrates the relation between the increase ratio of the hydrogen flow rate and time. The graph at the middle part of FIG. 24 illustrates the relation between the total hydrogen flow rate introduced into the chamber 12 and time. The graph at the lowermost part of FIG. 24 illustrates the relation between the pressure in the chamber 12 and time.

As illustrated in FIG. 24, in terms of the total hydrogen flow rate as well, the increase ratio of the hydrogen flow rate increases as time elapses or the pressure increases since the start of hydrogen introduction.

9.3 Effect

According to Embodiment 5, effects same as those of Embodiment 1 can be obtained.

10. Laser Apparatus

The laser apparatus 13 may be a master oscillator power amplifier (MOPA) system. For example, the laser apparatus 13 may include a master oscillator, an optical isolator, and a plurality of $CO_2$ laser amplifiers. The master oscillator may output, at a predetermined repetition frequency, a laser beam having a wavelength in the amplification region of each $CO_2$ laser amplifier. The wavelength of the laser beam output from the master oscillator may be, for example, 10.59 μm, and the predetermined repetition frequency may be, for example, 100 kHz.

In addition, the laser apparatus 13 may include a pre-pulse laser apparatus configured to output a pre-pulse laser beam, and a main pulse laser apparatus configured to output a main pulse laser beam. In the LPP EUV light generation apparatus 10, a diffused target may be formed by irradiating a droplet of the target with the pre-pulse laser beam to diffuse the target, and then may be irradiated with the main pulse laser beam. In this manner, plasma is efficiently generated from the target substance through irradiation of the diffused target with the main pulse laser beam. Accordingly, the conversion efficiency (CE) from the energy of the pulse laser beam into the energy of EUV light can be improved.

The pre-pulse laser beam for forming the diffused target includes short pulses each having a pulse width of 1 nanosecond [ns] or shorter, preferably 500 picoseconds [ps] or shorter, more preferably 50 picoseconds [ps] or shorter. The fluence of each pulse of the pre-pulse laser beam is equal to or smaller than the fluence of each pulse of the main pulse laser beam and 6.5 $J/cm^2$ or larger, preferably 30 $J/cm^2$ or larger, more preferably 45 $J/cm^2$ or larger.

With this configuration, the pulse width of each pulse of the pre-pulse laser beam can be shortened to break down the target into minute particles and diffuse the target. Accordingly, when the diffused target is irradiated with the main pulse laser beam, plasma is efficiently generated from the target, which results in improvement of the CE.

The target may be irradiated with a plurality of pre-pulse laser beams before irradiation with the main pulse laser beam.

Figure 25:
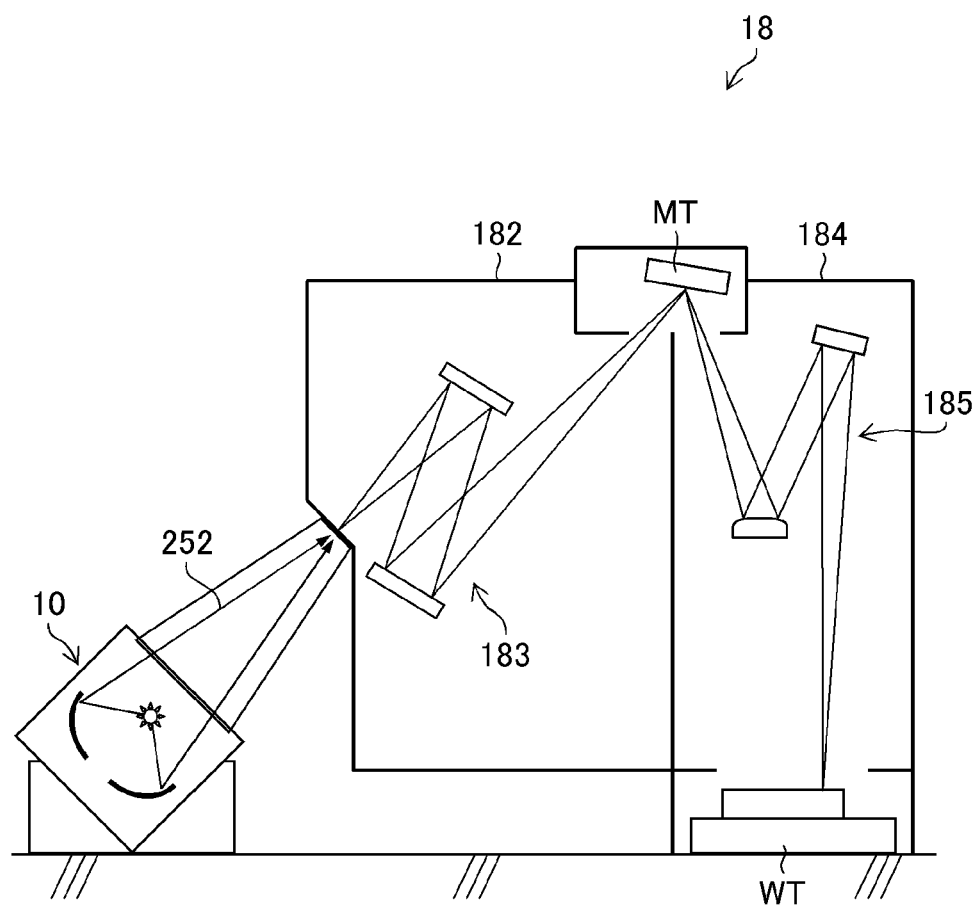
FIG. 25 is a diagram illustrating a schematic configuration of an exposure apparatus connected with each EUV light generation apparatus.

11. Exemplary Electronic Device Manufacturing Method Using EUV Light Generation Apparatus FIG. 25 is a diagram illustrating a schematic configuration of the exposure apparatus connected with the EUV light generation apparatus. In FIG. 25, the exposure apparatus 18 includes a mask irradiation unit 182 and a workpiece irradiation unit 184. The mask irradiation unit 182 illuminates a mask pattern on a mask table MT with the EUV light 252 incident from the EUV light generation apparatus 10 through a reflected optical system 183.

The workpiece irradiation unit 184 images the EUV light 252 reflected by the mask table MT onto a workpiece (not illustrated) disposed on a workpiece table WT through a reflected optical system 185.

The workpiece is a photosensitive substrate such as a semiconductor wafer on which photoresist is applied. The exposure apparatus 18 moves the mask table MT and the workpiece table WT in parallel to each other in synchronization to expose the workpiece to the EUV light with the mask pattern reflected.

A semiconductor device can be manufactured by transferring a device pattern onto the semiconductor wafer through the above-described exposure process. The semiconductor device is an exemplary electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus that generates plasma by irradiating a target substance with a pulse laser beam and generates extreme ultraviolet light from the plasma, the extreme ultraviolet light generation apparatus comprising:
    a chamber housing a collector mirror configured to condense the extreme ultraviolet light;
    a gas introduction pipe through which gas is introduced into the chamber;

a mass flow controller configured to change a flow rate of the gas;
a discharge pump configured to discharge the gas from the chamber;
a pressure sensor configured to monitor the pressure in the chamber; and
a control unit configured to control the mass flow controller based on the pressure measured by using the pressure sensor,
the control unit being configured to control the mass flow controller to increase an increase ratio of the flow rate of the gas entering the chamber as the pressure acquired by the pressure sensor increases, and
the increase ratio of the flow rate of the gas does not decrease from a time at which gas introduction starts until a time at which the flow rate reaches a target flow rate.

2. The extreme ultraviolet light generation apparatus according to claim 1, further comprising:
a droplet generator configured to output a target into the chamber; and
a container housing the droplet generator, wherein
the droplet generator includes a temperature adjuster, and
the container and the chamber communicate with each other.

3. The extreme ultraviolet light generation apparatus according to claim 1, wherein
a temperature of the gas is equal to or lower than 16° C.

4. The extreme ultraviolet light generation apparatus according to claim 1, wherein
the target substance is tin, and
the gas is hydrogen.

5. The extreme ultraviolet light generation apparatus according to claim 1, wherein the control unit
increases the flow rate of the gas at a first increase ratio when the pressure is between first pressure and second pressure higher than the first pressure, and
increases the flow rate of the gas at a second increase ratio higher than the first increase ratio when the pressure is between the second pressure and a third pressure higher than the second pressure.

6. The extreme ultraviolet light generation apparatus according to claim 1, wherein
the control unit increases the increase ratio of the flow rate of the gas in accordance with a pressure function having a second order differential that is zero or positive.

7. The extreme ultraviolet light generation apparatus according to claim 1, wherein
the control unit increases the increase ratio of the flow rate of the gas in accordance with a pressure linear function.

8. The extreme ultraviolet light generation apparatus according to claim 1, wherein
the control unit increases the increase ratio of the flow rate of the gas at stages of three change steps or more.

9. The extreme ultraviolet light generation apparatus according to claim 1, further comprising
a plurality of the mass flow controllers, wherein
the control unit controls the mass flow controllers to increase an increase ratio of a total flow rate of the gas entering the chamber as the pressure acquired by the pressure sensor increases.

10. The extreme ultraviolet light generation apparatus according to claim 1, wherein
an initial increase ratio of the flow rate of the gas at start of introduction of the gas into the chamber is 0.05 slm/s to 1.0 slm/s inclusive.

11. An electronic device manufacturing method comprising:
generating extreme ultraviolet light by using the extreme ultraviolet light generation apparatus according to claim 1;
outputting the extreme ultraviolet light to an exposure apparatus; and
exposing a photosensitive substrate to the extreme ultraviolet light in the exposure apparatus to manufacture an electronic device.

12. An extreme ultraviolet light generation apparatus that generates plasma by irradiating a target substance with a pulse laser beam and generates extreme ultraviolet light from the plasma, the extreme ultraviolet light generation apparatus comprising:
a chamber housing a collector mirror configured to condense the extreme ultraviolet light;
a gas introduction pipe through which gas is introduced into the chamber;
a mass flow controller configured to change a flow rate of the gas;
a discharge pump configured to discharge the gas from the chamber;
a timer configured to measure a time since start of introduction of the gas into the chamber; and
a control unit configured to control the mass flow controller based on the time measured by using the timer,
the control unit being configured to control the mass flow controller to increase an increase ratio of the flow rate of the gas entering the chamber as the time measured by using the timer elapses, and
the increase ratio of the flow rate of the gas does not decrease from a time at which gas introduction starts until a time at which the flow rate reaches a target flow rate.

13. The extreme ultraviolet light generation apparatus according to claim 12, further comprising:
a droplet generator configured to output a target into the chamber; and
a container housing the droplet generator, wherein
the droplet generator includes a temperature adjuster, and
the container and the chamber communicate with each other.

14. The extreme ultraviolet light generation apparatus according to claim 12, wherein the control unit
increases the flow rate of the gas at a first increase ratio when the time is between a first time and a second time later than the first time, and
increases the flow rate of the gas at a second increase ratio higher than the first increase ratio when the time is between the second time and a third time later than the second time.

15. The extreme ultraviolet light generation apparatus according to claim 12, wherein
the control unit increases the increase ratio of the flow rate of the gas in accordance with a time function having a second order differential that is zero or positive.

16. The extreme ultraviolet light generation apparatus according to claim 12, wherein
the control unit increases the increase ratio of the flow rate of the gas in accordance with a time linear function.

17. The extreme ultraviolet light generation apparatus according to claim 12, wherein
the control unit increases the increase ratio of the flow rate of the gas at stages of three change steps or more.

18. The extreme ultraviolet light generation apparatus according to claim 12, further comprising a plurality of the mass flow controllers, wherein
the control unit controls the mass flow controllers to increase an increase ratio of a total flow rate of the gas entering the chamber as the time measured by the timer elapses.

19. The extreme ultraviolet light generation apparatus according to claim 12, wherein
an initial increase ratio of the flow rate of the gas at the start of introduction of the gas into the chamber is 0.05 slm/s to 1.0 slm/s inclusive.

20. An electronic device manufacturing method comprising:
generating extreme ultraviolet light by using the extreme ultraviolet light generation apparatus according to claim 12;
outputting the extreme ultraviolet light to an exposure apparatus; and
exposing a photosensitive substrate to the extreme ultraviolet light in the exposure apparatus to manufacture an electronic device.

* * * * *